United States Patent
Jung et al.

(10) Patent No.: US 9,960,299 B2
(45) Date of Patent: May 1, 2018

(54) AVALANCHE PHOTODIODE USING SILICON NANOWIRE AND SILICON NANOWIRE PHOTOMULTIPLIER USING THE SAME

(71) Applicant: KOREA ELECTRONICS TECHNOLOGY INSTITUTE, Seongnam-si, Gyeonggi-do (KR)

(72) Inventors: Suk Won Jung, Osan-si (KR); Yeon Shik Choi, Seoul (KR); Young Chang Jo, Yongin-si (KR); Jae Gi Son, Yongin-si (KR); Ki Man Jeon, Seongnam-si (KR); Woo Kyeong Seong, Seongnam-si (KR); Kook Nyung Lee, Seoul (KR); Min Ho Lee, Seoul (KR); Hyuck Ki Hong, Uijeongbu-si (KR)

(73) Assignee: KOREA ELECTRONICS TECHNOLOGY INSTITUTE, Seongnam-si (KR)

( * ) Notice: Subject to any disclaimer, the term of this patent is extended or adjusted under 35 U.S.C. 154(b) by 0 days. days.

(21) Appl. No.: 15/212,084

(22) Filed: Jul. 15, 2016

(65) Prior Publication Data

US 2017/0186895 A1    Jun. 29, 2017

(30) Foreign Application Priority Data

Dec. 29, 2015 (KR) ........................ 10-2015-0188463

(51) Int. Cl.
*H01L 31/0352* (2006.01)
*H01L 27/02* (2006.01)
*H01L 27/144* (2006.01)
(Continued)

(52) U.S. Cl.
CPC .. *H01L 31/035227* (2013.01); *H01L 27/0248* (2013.01); *H01L 27/1443* (2013.01);
(Continued)

(58) Field of Classification Search
None
See application file for complete search history.

(56) References Cited

U.S. PATENT DOCUMENTS 7,211,464 B2 *  5/2007  Lieber ..................... B01J 23/50
                                              257/E23.165
7,598,482 B1 * 10/2009  Verhulst ............. H01L 31/0352
                                              250/214.1
(Continued)

FOREIGN PATENT DOCUMENTS

KR  10-2011-0015603 A   2/2011
WO  WO 2009/136906 A1  11/2009

OTHER PUBLICATIONS

"Single-photon avalanche photodiode with integrated quenching resistor" Mazzillo et al. ScienceDirect Nuclear Instruments and Methods in Physics Research A 591 (2008) 367-373.*

(Continued)

*Primary Examiner* — Marc Armand
*Assistant Examiner* — Sue Tang
(74) *Attorney, Agent, or Firm* — Knobbe, Martens, Olson & Bear, LLP

(57) ABSTRACT

Disclosed is an avalanche photodiode using a silicon nanowire, including a first silicon nanowire formed of silicon (Si), a first conductive region formed by doping one surface of the first silicon nanowire with a first dopant, and a second conductive region formed by doping one surface of the first silicon nanowire with a second dopant having a conductive type different from that of the first dopant so as to be arranged continuously in a longitudinal direction from the first conductive region, wherein, when the magnitude of a reverse voltage applied to both ends of the first silicon nanowire is equal to or greater than a preset breakdown voltage, avalanche multiplication of inner current occurs due to the incidence of light from the outside.

5 Claims, 30 Drawing Sheets

(51) Int. Cl.
*H01L 31/0224* (2006.01)
*H01L 31/028* (2006.01)
*H01L 31/107* (2006.01)
*H01L 31/18* (2006.01)

(52) U.S. Cl.
CPC .... *H01L 31/028* (2013.01); *H01L 31/022408* (2013.01); *H01L 31/107* (2013.01); *H01L 31/1804* (2013.01); *H01L 31/1864* (2013.01)

(56) References Cited

U.S. PATENT DOCUMENTS

2009/0027763 A1\* 1/2009 Zhang .................. B81B 3/0054
359/320
2013/0207075 A1\* 8/2013 Myers .................. B82Y 10/00
257/13

OTHER PUBLICATIONS

Mazzillo, M. et al., Single-photon avalanche photodiodes with integrated quenching resistor; Mar. 15, 2008. Nuclear Instruments and Methods in Physics Research (Section A, 591) pp. 367-373.

Office Action received in Korean Patent Application 10-2015-0188463, dated Oct. 20, 2017.

Yang, Chen et al., Single p-Type/Intrinsic/n-Type Silicon Nanowires as Nanoscale Avalanche Photodetectors; Oct. 19, 2006. Nano Letters (vol. 6, No. 12) pp. 2929-2934.

Yang, Kyungwhan et al., Influence of the intrinsic length on $p^+$-i-$n^+$ Si nanowire avalanche photodetectors on flexible plastic substrates; Feb. 7, 2014. Phys. Status Solidi C (vol. 11, No. 2) pp. 217-221.

\* cited by examiner

AVALANCHE PHOTODIODE USING SILICON NANOWIRE AND SILICON NANOWIRE PHOTOMULTIPLIER USING THE SAME

CROSS-REFERENCE TO RELATED APPLICATION

This application claims the benefit of Korean Patent Application No. 10-2015-0188463, filed Dec. 29, 2015, entitled "Avalanche Photodiode using Silicon Nanowire and Silicon Nanowire Photomultiplier using the Same", which is hereby incorporated by reference in its entirety into this application.

BACKGROUND OF THE INVENTION

Field of the Invention

The present invention relates to an avalanche photodiode using a silicon nanowire and a silicon nanowire photomultiplier using the avalanche photodiode.

Description of the Related Art

A silicon photomultiplier (SiPM) has been proposed to replace a conventional photomultiplier tube (PMT). The silicon photomultiplier and the photomultiplier tube are devices for detecting single photon. A conventional silicon photomultiplier (SiPM) includes a plurality of micropixels. Each micropixel uses an avalanche photodiode (APD) for outputting a signal amplified by avalanche gain in response to photons incident thereon.

A nanowire device uses a nano-scale nanowire, and is applied to various fields, and research and development thereon for application in semiconductor fields is ongoing. In order to fabricate a nanowire device, it is important to manufacture a nanowire.

Methods of manufacturing a nanowire device are broadly classified into two depending on the type of approach, namely a "top-down" process, for directly manufacturing a nanowire device at a desired position by etching a material such as silicon using a conventional semiconductor process, especially ultrafine photolithography, and a "bottom-up" process for synthesizing nanowires using VLS (Vapor-Liquid Solid) growth and aligning them at a specific position to manufacture a nanowire device.

The VLS growth method is employed in nanowire growth for most semiconductors and metal materials, such as Si, ZnO, GaN, InP, and metals. However, the fabrication of a nanowire device requires the formation of an additional structure such as an electrode after the grown nanowires are aligned at a desired position.

The position at which the nanowires are to be aligned is controlled by the process of aligning nanowires at a desired position through any process, such as electrophoresis for nanowire device applications, or aligning nanowires through fluid flow using fluid channels.

However, even when such a process is used, it is very difficult to precisely control the position at which nanowires are located, and low yield may result even after the aligning process.

Furthermore, an additional electrode structure for the electrical connection of aligned nanowires is fabricated using an expensive e-beam lithography process.

The top-down method of manufacturing a nanowire device includes directly forming a nanowire by etching silicon. Since the formation of nanowires having a diameter of ones of nm requires an ultrafine pattern, an ultrafine patterning process such as e-beam lithography is adopted. Although nanowires may be formed to a desired size at a desired position through such a top-down process, expensive equipment, such as an e-beam lithographer is required, and the production rate is low. Moreover, the nanowires obtained thus are non-uniform compared to nanowires obtained by self-alignment, and the nanowires have to be fabricated on an insulator in order to function as an electric device.

CITATION LIST

Patent Literature (Patent Document 1) KR2011-0015603 A

SUMMARY OF THE INVENTION

Accordingly, the present invention has been made keeping in mind the problems encountered in the related art, and the present invention is intended to provide a silicon nanowire and a silicon nanowire array comprising a plurality of silicon nanowires spaced apart from each other at a predetermined interval in a predetermined direction.

In addition, the present invention is intended to provide an avalanche photodiode using a silicon nanowire by forming a conductive region on the silicon nanowire through a doping process.

In addition, the present invention is intended to provide a silicon nanowire photomultiplier, which includes an avalanche photodiode using a silicon nanowire and a quenching resistor using a silicon nanowire, electrically connected thereto.

The present invention provides an avalanche photodiode using a silicon nanowire, comprising: a first silicon nanowire formed of silicon (Si), a first conductive region formed by doping one surface of the first silicon nanowire with a first dopant, and a second conductive region formed by doping one surface of the first silicon nanowire with a second dopant having a conductive type different from that of the first dopant so as to be arranged continuously in a longitudinal direction from the first conductive region, wherein, when a magnitude of a reverse voltage applied to both ends of the first silicon nanowire is equal to or greater than a preset breakdown voltage, avalanche multiplication of inner current occurs due to incidence of light from the outside.

Also, the first silicon nanowire may further include an avalanche region, which is formed at a junction between the first conductive region and the second conductive region and in which avalanche multiplication of inner current occurs due to incidence of light from the outside.

Also, the first conductive region may be configured such that a P-type semiconductor region, a P(i)-type semiconductor region and a P$^+$-type semiconductor region are sequentially formed in a longitudinal direction, and the second conductive region may be configured such that an N-type semiconductor region and an N$^+$-type semiconductor region are sequentially formed in a longitudinal direction so as to be arranged continuously from the P-type semiconductor region of the first conductive region.

In addition, the present invention provides a silicon nanowire photomultiplier, comprising: the avalanche photodiode as above, and a quenching resistor formed of a second silicon nanowire comprising silicon (Si), in which one end of the second silicon nanowire is connected in series to one end of the first silicon nanowire.

Also, the quenching resistor may be formed by doping a P-type dopant or an N-type dopant.

Also, the quenching resistor may be configured such that the second silicon nanowire is formed at a predetermined interval in a longitudinal direction from one end of the first silicon nanowire, and a P$^+$-type semiconductor region, a P-type semiconductor region and a P$^+$-type semiconductor region are sequentially formed in a longitudinal direction.

Also, the quenching resistor may be configured such that the second silicon nanowire is formed continuously in a longitudinal direction from one end of the first silicon nanowire, and an N-type semiconductor region and an N$^+$-type semiconductor region are sequentially formed in a longitudinal direction.

Also, the first silicon nanowire and the second silicon nanowire may be formed at the upper portion of a silicon nanowire structure having an inner angle θ that falls within a predetermined range, and a line width a of the silicon nanowire is determined by Equation 1 below:

$$a = W - 2*0.45*T*((1+\cos(\theta))/(\sin(\theta))) \quad \text{[Equation 1]}$$

(wherein a is the line width of a silicon nanowire, W is the width of the silicon nitride film of a silicon nanowire structure, T is the thickness of an oxide film formed on the surface of the silicon nanowire structure, and θ is the inner angle of the silicon nanowire structure.)

In addition, the present invention provides a silicon nanowire photomultiplier, comprising: an avalanche photodiode array comprising one or more avalanche photodiodes as above, which are spaced apart from each other at a predetermined interval in a width direction, and a quenching resistor array comprising one or more quenching resistors which are formed of silicon nanowires and are electrically connected to one end of the first silicon nanowire.

Also, the quenching resistor array may be configured such that the quenching resistors are formed by doping a P-type or N-type dopant.

Also, the quenching resistor array may be spaced apart from one end of the avalanche photodiode array at a predetermined interval in a longitudinal direction, and each of the quenching resistors may be configured such that a P$^+$-type semiconductor region, a P-type semiconductor region and a P$^+$-type semiconductor region are sequentially formed in a longitudinal direction.

Also, the quenching resistor array may be formed continuously in a longitudinal direction from one end of the avalanche photodiode array, and each of the quenching resistors may be configured such that an N-type semiconductor region and an N$^+$-type semiconductor region are sequentially formed in a longitudinal direction.

In addition, the present invention provides a method of manufacturing a silicon nanowire avalanche photodiode, comprising: (A) etching a silicon (Si) substrate to form a plurality of column structures which are spaced apart from each other at a predetermined interval, and performing anisotropic wet etching of a lateral surface of each of the column structures, thus forming a first silicon nanowire structure, (B) oxidizing the surface of each of the first silicon nanowire structure, forming an oxide film on a surface of the first silicon nanowire structure, thus forming a first silicon nanowire at an upper portion of the first silicon nanowire structure, and (C) doping the first silicon nanowire with different types of dopants, thus forming a first conductive region and a second conductive region, which are arranged continuously in a longitudinal direction of the first silicon nanowire, thereby forming an avalanche photodiode array using a silicon nanowire.

Also, (A) may include: (A1) sequentially layering a silicon oxide film and a silicon nitride film on the substrate and subjecting the substrate to dry etching to a predetermined depth, thus forming a plurality of column structures, (A2) subjecting a lateral surface of each of the column structures to wet etching, thus forming a first silicon nanowire structure.

Also, (C) may include: (C1) doping a predetermined portion of the first silicon nanowire with a first dopant, thus forming a first region, (C2) doping a predetermined portion of the first region with a second dopant having a conductive type different from that of the first dopant, thus forming a second region, (C3) doping a predetermined portion of the second region with the second dopant, thus forming an N$^+$-type semiconductor region, and (C4) doping a remaining portion of the first silicon nanowire with the first dopant, thus forming a P$^+$-type semiconductor region, thereby forming an avalanche photodiode array using a silicon nanowire.

Also, the method may further include: (D) depositing a metal on the P$^+$-type semiconductor region and the N$^+$-type semiconductor region of the avalanche photodiode array and performing thermal treatment, thus forming a silicide layer, and (E) forming an electrode insulated from the substrate and connected to the silicide layer.

Also, (D) may include: (D1) forming an oxide film on the avalanche photodiode array and performing patterning and etching, thus removing the oxide film from the P$^+$-type semiconductor region and the N$^+$-type semiconductor region, (D2) depositing a metal layer on the avalanche photodiode array and performing heating to a first temperature, thus forming a first silicide layer on the P$^+$-type semiconductor region and the N$^+$-type semiconductor region, and (D3) removing the metal layer and performing heating to a second temperature, thus forming the first silicide layer into a second silicide layer.

Also, (E) may include: (E1) depositing a first dielectric layer on the avalanche photodiode array and performing patterning and etching, thus forming a contact hole for exposing the second silicide layer, and (E2) depositing a metal on the avalanche photodiode array and performing patterning, thus forming an electrode connected to the second silicide layer.

According to the present invention, an avalanche photodiode using a nanowire can be increased in sensitivity and responsivity.

Also, according to the present invention, since a plurality of silicon nanowires are unidirectionally and regularly arranged, different types of dopants having different concentrations can be easily implanted in the longitudinal direction of the nanowire in the doping process.

Also, according to the present invention, since the thickness of the silicon nanowire is nano-sized, the diffusion time of the doped dopant is short, thus considerably reducing the processing time.

Also, a large number of silicon nanowires can be provided in the form of an array on a substrate and can be easily doped with dopants, and can thus be effectively applied to photomultipliers for photon counters, including a large number of avalanche photodiodes.

DETAILED DESCRIPTION OF THE PREFERRED EMBODIMENT

Figure 1:
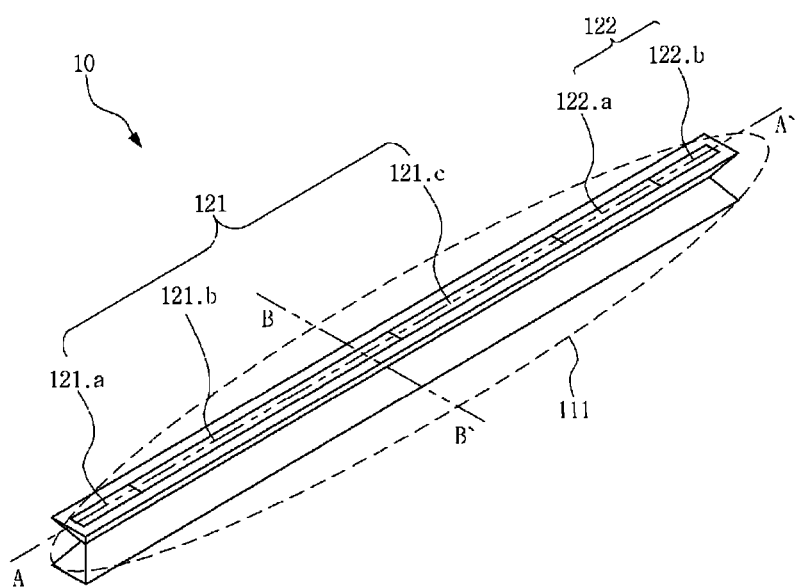
FIG. 1 is a perspective view illustrating an avalanche photodiode using a silicon nanowire according to a first embodiment of the present invention.

The aspects, specific advantages and novel features of the present invention will be more clearly understood from the following detailed description and embodiments when taken in conjunction with the accompanying drawings. Wherever possible, the same reference numerals will be used throughout the drawings and the description to refer to the same or like parts. Furthermore, the terms "one side," "the remaining side," "first," "second," etc. are only used to distinguish one element from another element, and these elements should not be limited by these terms. In the following description, it is to be noted that a detailed description of the related art, when it would make the gist of the present invention unclear, will be omitted.

Hereinafter, a detailed description will be given of embodiments of the present invention with reference to the appended drawings.

Avalanche Photodiode Using Silicon Nanowire (First Embodiment 10)

Figure 2:
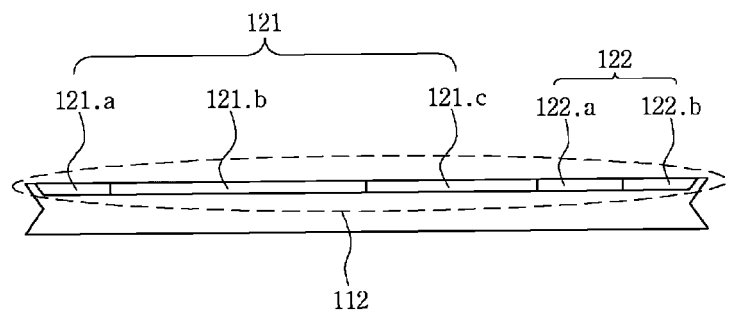
FIG. 2 is a cross-sectional view taken along the line A-A' of FIG. 1.
Figure 3:
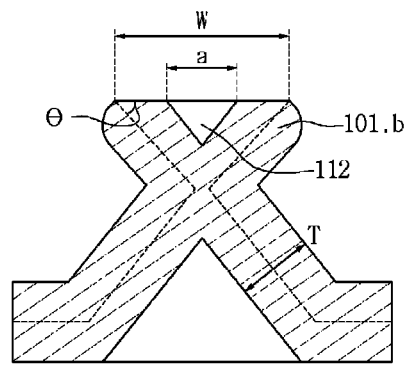
FIG. 3 is a cross-sectional view taken along the line B-B' of FIG. 1.

FIG. 1 illustrates an avalanche photodiode using a silicon nanowire according to the present invention, FIG. 2 is a cross-sectional view taken along the line A-A' of FIG. 1, and FIG. 3 is a cross-sectional view taken along the line B-B' of FIG. 1.

The avalanche photodiode using the nanowire according to the first embodiment 10 of the present invention includes: a first silicon nanowire 112 formed of silicon (Si), a first conductive region 121 formed by doping one surface of the first silicon nanowire 112 with a first dopant, and a second conductive region 122 formed by doping one surface of the first silicon nanowire 112 with a second dopant having a conductive type different from that of the first dopant so as to be arranged continuously in the longitudinal direction from the first conductive region 121. When the magnitude of the reverse voltage applied to both ends of the first silicon nanowire 112 is equal to or greater than a preset breakdown voltage, avalanche multiplication of inner current occurs due to the incidence of light from the outside.

The first silicon nanowire 112 further includes an avalanche region, which is formed at a junction of the first conductive region 121 and the second conductive region 122 and in which avalanche multiplication of inner current occurs due to the incidence of light from the outside.

The first conductive region 121 is configured such that a P$^+$-type semiconductor region 121.a, a P(i)-type semiconductor region 121.b, and a P-type semiconductor region 121.c are sequentially formed in the longitudinal direction, and the second conductive region 122 is configured such that an N-type semiconductor region 122.a and an N$^+$-type semiconductor region 122.b are sequentially formed in the longitudinal direction so as to be arranged continuously from the P-type semiconductor region 121.c of the first conductive region 121.

Figure 23A:
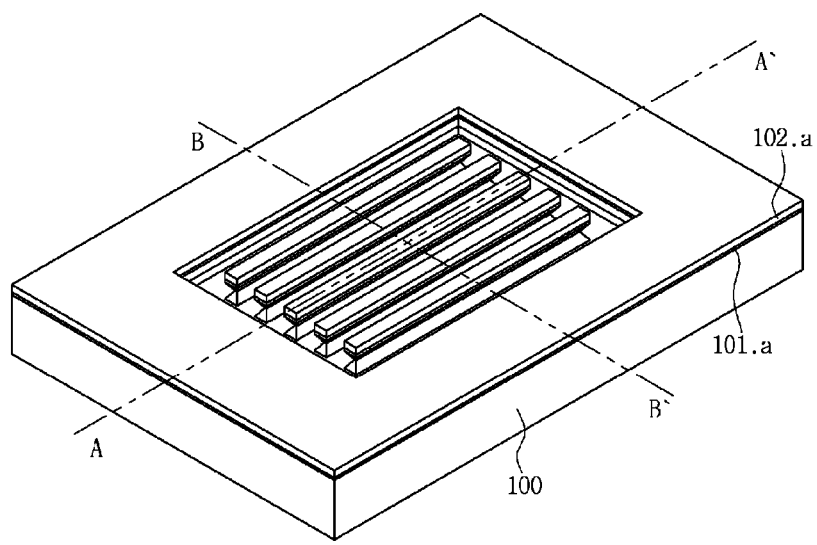
FIG. 23A illustrates the formation of a silicon nanowire on the substrate of FIG. 22A through an oxide film formation process.
Figure 23B:
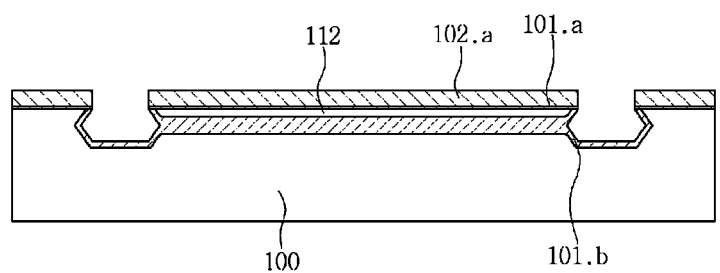
FIG. 23B is a cross-sectional view taken along the line A-A' of FIG. 23A.
Figure 23C:
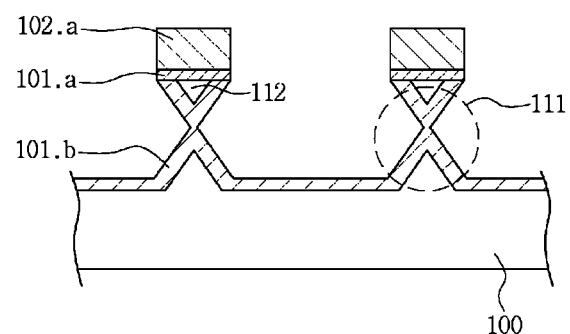
FIG. 23C is a cross-sectional view taken along the line B-B' of FIG. 23A.
Figure 23D:
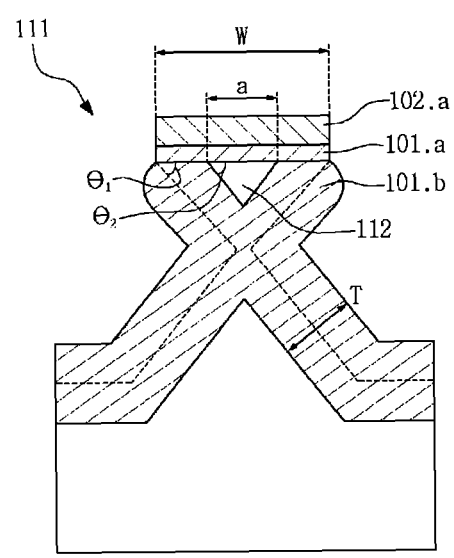
FIG. 23D is a cross-sectional view of the nanowire structure resulting from a wet oxide film formation process in the presence of the silicon nitride film on the nanowire structure having an hourglass shape formed through wet etching of the column structure.

As illustrated in FIG. 3 and FIG. 23D. The first nanowire 112 is formed at the upper portion of a first silicon nanowire structure 111, which has an inner angle θ that falls within a predetermined range, and the line width a of the first silicon nanowire 112 is determined based on the following Equation 1.

$$a = W - 2*0.45*T*((1+\cos(\theta))/(\sin(\theta))) \quad \text{[Equation 1]}$$

(wherein a is the line width of a silicon nanowire, W is the width of the silicon nitride film of a silicon nanowire structure, T is the thickness of an oxide film formed on the surface of the silicon nanowire structure, and θ is the inner angle of the silicon nanowire structure.)

As illustrated in FIGS. 1 to 3. The first silicon nanowire structure 111 (FIG. 3) is formed with an hourglass-shaped cross-section by etching the center of the lateral surface along the Miller index (111) crystal plane of silicon, with a predetermined inner angle θ defined by the upper surface and the lateral surface of the first silicon nanowire structure 111. And the first silicon nanowire 112 is formed at the upper portion of the first silicon nanowire structure 111.

The first silicon nanowire 112 includes a first conductive region 121, doped with a first dopant, and a second conductive region 122, doped with a second dopant, arranged in the longitudinal direction thereof. As such, the first dopant is a P-type dopant (B), and the second dopant is an N-type dopant (P, As). However, the first dopant and the second dopant are not limited to the present embodiment, and the first dopant may be an N-type dopant (P, As) and the second dopant may be a P-type dopant (B).

The first conductive region 121 and the second conductive region 122 are formed continuously in the longitudinal direction of the first silicon nanowire 112. The first conductive region 121 includes a P$^+$-type semiconductor region 121.a, a P(i)-type semiconductor region 121.b, and a P-type semiconductor region 121.c, which are sequentially formed, and the second conductive region 122 includes an N-type semiconductor region 122.a and an N$^+$-type semiconductor region 122.b, which are formed continuously in the longitudinal direction of the first silicon nanowire from the P-type semiconductor region 121.c of the first conductive region 121. Thus, the semiconductor layer of the avalanche photodiode using the first silicon nanowire 112 is configured such that P$^+$-, P(i)-, P-, N-, and N$^+$-type semiconductor regions are sequentially formed.

Below is a description of the operation of the avalanche photodiode using the first silicon nanowire 112.

Figure 4:
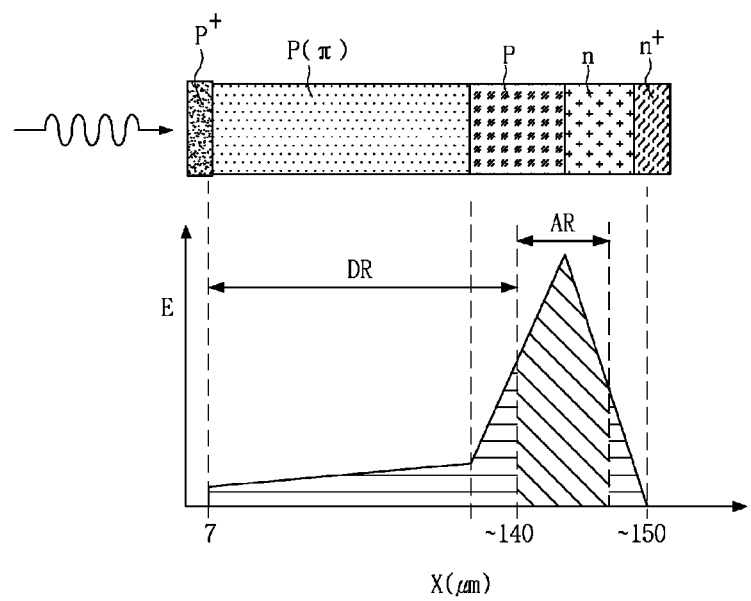
FIG. 4 illustrates the intensity of an electric field E depending on the configuration and depth X of a conductive region of a conventional semiconductor APD.

When describing the operation of a conventional APD, Geiger-mode refers to the application of a reverse bias voltage equal to or greater than a breakdown voltage to operate the APD, and avalanche multiplication requires an electric field of at least about $(2-4) \times 10^5$ V/cm. With reference to FIG. 4, the conventional APD is configured such that P$^+$-, P(π)-, P-, N-, and N$^+$-type semiconductor regions are layered in the depth direction of the semiconductor substrate. Photons are incident on the APD, whereby electron-hole pairs are produced in the absorption region P(π), and the produced electrons and holes drift into respective ends (Drift Region: DR, FIG. 4), yielding carriers. The carriers formed by incidence of the photons reach the avalanche region (AR, FIG. 4) of the P-N junction, where a strong electric field is formed, thus generating avalanche current.

Likewise, when reverse bias is applied to the avalanche photodiode using the first silicon nanowire 112, the strongest electric field is formed at the boundary (P-N junction) between the P-type semiconductor region 121.c and the N-type semiconductor region 122.a, and the avalanche multiplication region is formed at this boundary. Therefore, when the avalanche photodiode using the silicon nanowire according to the first embodiment 10 is operated by applying reverse bias thereto, photons are incident thereon to thus form carriers, and avalanche current is generated in the avalanche multiplication region.

The avalanche photodiode using the silicon nanowire according to the first embodiment 10 exhibits sensitivity and responsivity superior to those of conventional APDs. The reason is due to the high gain characteristics of a photodetector using a silicon nanowire. Below, the high gain of the photodetector using the silicon nanowire is described.

Figure 5:
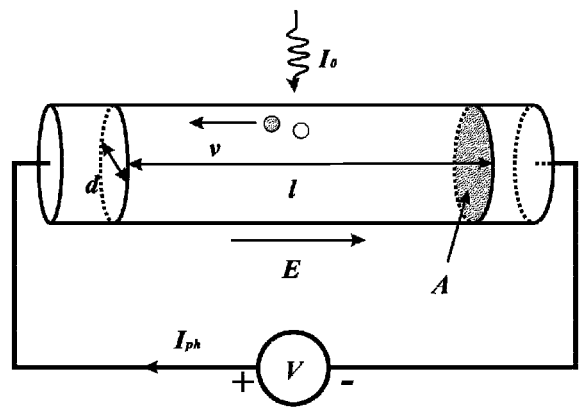
FIG. 5 illustrates the operating model of a silicon nanowire photodetector.

FIG. 5 illustrates the operating model of a silicon nanowire photodetector. With reference to FIG. 5, when light is incident on the silicon nanowire, photons having larger energy than the energy band gap of silicon break the bonds of silicon to thus produce electron-hole pairs, thereby increasing the conductivity of the silicon nanowire. As such, photocurrent may be represented by the following Equation 2.

$$I_{ph} = qg\left(\frac{\tau_p}{t_n}\right)\left[1 + \left(\frac{\mu_p}{\mu_n}\right)\right] lA \qquad \text{[Equation 2]}$$

(wherein $I_{ph}$ is the photocurrent, q is the electron charge, g is the carrier production rate, $\mu_p$ is the carrier (hole) mobility, $\mu_n$ is the carrier (electron) mobility, $\tau_p$ is the hole recombination lifetime, $t_n$ is the electron transit time through a nanowire, 1 is the length of a detector, and A is the cross-sectional area of a nanowire.)

The gain of the silicon nanowire photodetector may be represented by the following Equation 3.

$$G = \frac{\tau_p}{t_n} \qquad \text{[Equation 3]}$$

(wherein G is the gain, $\tau_p$ is the hole recombination lifetime, and $t_n$ is the electron transit time through a silicon nanowire.)

When electron-hole pairs are produced in the photodetector, the electrons migrate at a high rate to the (+) electrode and the holes migrate at a slow rate to the (−) electrode. This procedure is repeated until the holes disappear through recombination, and the gain (G) of the nanowire photodetector may be represented by the ratio of the hole recombination lifetime to the electron transit time.

Actually, the discontinuity of lattices on the surface of the silicon nanowire forms a high energy state in the forbidden band. This energy state is called a surface state, and typically functions to increase the recombination rate of carriers on the surface, thus decreasing the hole recombination lifetime ($\tau_p$) to thereby remarkably lower the gain of the silicon nanowire photodetector.

However, when light is not applied, free holes in the valence band are captured by the surface due to the effect of the surface state of the silicon nanowire surface, and the inside of the silicon nanowire body is depleted, thereby forming an electric field that faces outward from the center of the silicon nanowire. When light is radiated onto the silicon nanowire, the electrons, among the electron-hole pairs produced in the silicon nanowire, migrate toward the outside of the nanowire due to an electric field and are thus recombined with the holes captured on the surface, thereby disappearing. On the other hand, the holes are isolated in the center of the silicon nanowire by an electric field, and thus the lifetime of the holes is remarkably increased. Thus, the silicon nanowire photodetector has high gain based on Equation 3. Since current gain is high due to the incidence of photons based on the characteristics of the silicon nanowire itself, the sensitivity of the avalanche photodiode using the silicon nanowire is increased compared to that of conventional semiconductor APDs.

Figure 6:
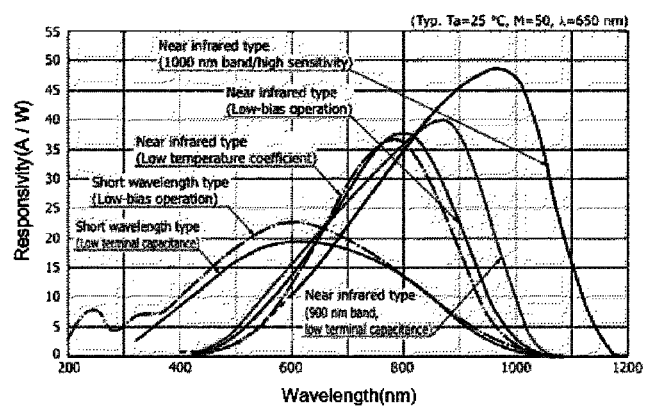
FIG. 6 is a graph illustrating the responsivity of a conventional APD depending on the wavelength.
Figure 7:
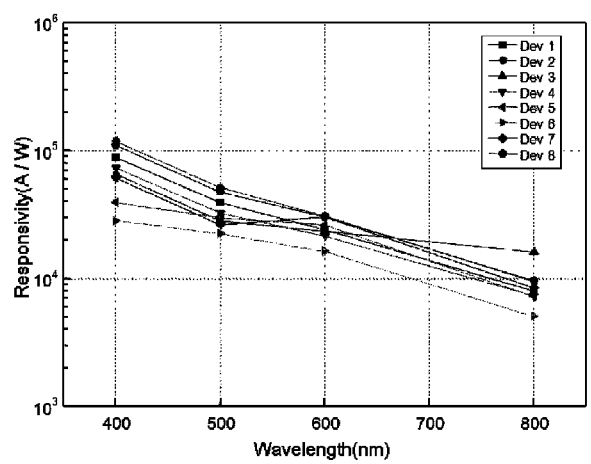
FIG. 7 is a graph illustrating the responsivity of a silicon nanowire photodetector depending on the wavelength.

FIG. 6 is a graph illustrating the responsivity of a conventional APD, and FIG. 7 is a graph illustrating the responsivity of the silicon nanowire photodetector at different wavelengths. The responsivity is represented as the ratio of output current relative to the amount of incident light in the photodetector, etc., and is shown in units of A/W. The responsivity of the conventional APD has a value increased by a maximum of about 50 due to avalanche multiplication (FIG. 6). However, the silicon nanowire photodetector has high responsivity ranging from $5.1 \times 10^3$ A/W to $1.2 \times 10^5$ A/W (FIG. 7). This responsivity is regarded as very high compared to that of conventional silicon semiconductor APDs.

With reference to FIG. 6, the responsivity of the conventional APD is low, at a short wavelength of about 400 nm. This is because short-wavelength light has a very high attenuation constant compared to long-wavelength light and is mainly absorbed near the surface of the APD, thus having difficulty reaching the light absorption layer. However, the silicon nanowire is thin and the silicon nanowire itself is used as the absorption region and thus facilitates the absorption of short-wavelength light. Hence, the responsivity is set to a maximum of $10^5$ A/W at short wavelengths near 400 nm (FIG. 7). Long-wavelength light may efficiently pass through the silicon nanowire, and thus has relatively low responsivity compared to short-wavelength light. In the case of long-wavelength light, however, the responsivity of the nanowire photodetector is in the vicinity of $10^4$ A/W, which is evaluated to be sufficiently high compared to the conventional semiconductor APD.

Based on the characteristics of the silicon nanowire as mentioned above, the photodiode using the silicon nanowire in the embodiments of the present invention exhibits very high gain, sensitivity, and responsivity.

Silicon Nanowire Photomultiplier Including Quenching Resistor 140 (Second and Third Embodiments 20, 30)

Below is a description of a silicon nanowire photomultiplier according to embodiments of the present invention, made with reference to other drawings, and any description that overlaps the description of the first embodiment 10 is omitted.

With reference to FIGS. 8 to 11, the silicon nanowire photomultiplier according to second and third embodiments 20, 30 of the present invention includes the avalanche photodiode using the silicon nanowire of the first embodiment, and a second silicon nanowire 132 formed of silicon (Si), and further includes a quenching resistor 140, in which one end of the second silicon nanowire 132 is connected in series to one end of the first silicon nanowire 112.

The quenching resistor 140 is formed by doping a P-type dopant or an N-type dopant.

The second nanowire 132 is formed at the upper portion of a second silicon nanowire structure 131, an inner angle θ of which falls within a predetermined range, and the line width a of the second silicon nanowire 132 is determined by Equation 1 below. For the cross-section of the second nanowire, reference is to be made to FIG. 3 and FIG. 23D, showing the cross-section of the first nanowire.

$$a=W-2*0.45*T*((1+\cos(\theta))/(\sin(\theta))) \quad \text{[Equation 1]}$$

(wherein a is the line width of a silicon nanowire, W is the width of the silicon nitride film of a silicon nanowire structure, T is the thickness of an oxide film formed on the surface of the silicon nanowire structure, and θ is the inner angle of the silicon nanowire structure.)

The avalanche photodiode of the silicon nanowire photomultiplier according to the second and third embodiments 20, 30 is the same as that of the first embodiment 10. The quenching resistor 140 is formed of the second silicon nanowire 132 that is the same as the first silicon nanowire 112 of the first embodiment 10, and is formed by doping the second silicon nanowire 132 with a P-type or N-type dopant.

The resistor region 143, which is positioned at the center of the second silicon nanowire 132, is a conductive region formed by doping the silicon nanowire with a dopant, and the electrode regions 141, 142, which are positioned in predetermined portions of both ends of the silicon nanowire, are doped with high-concentration dopants. The resistance value of the quenching resistor 140 may be adjusted by the concentration of the dopant doped to the resistor region 143. The dopant doped to the quenching resistor 140 is either an N-type dopant or a P-type dopant. The doping of the first silicon nanowire 112 may be performed together with the doping process for forming the quenching resistor 140 on the second silicon nanowire 132.

Figure 8:
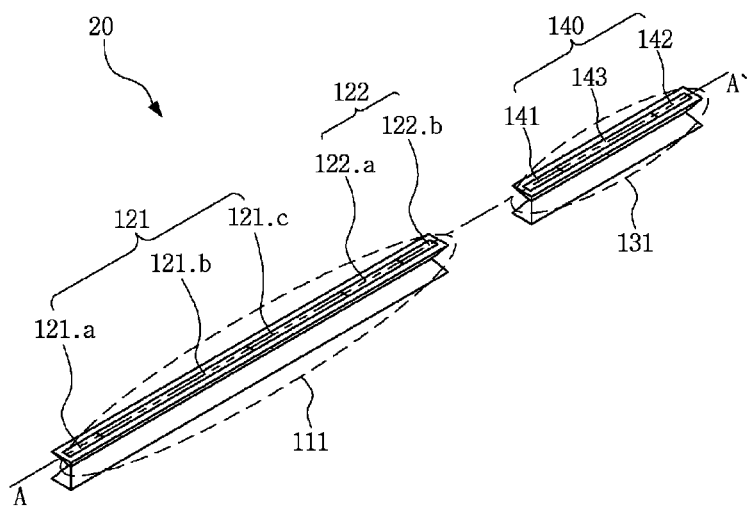
FIG. 8 illustrates a photomultiplier using a silicon nanowire, which includes a spaced quenching resistor, according to a second embodiment of the present invention.
Figure 9:
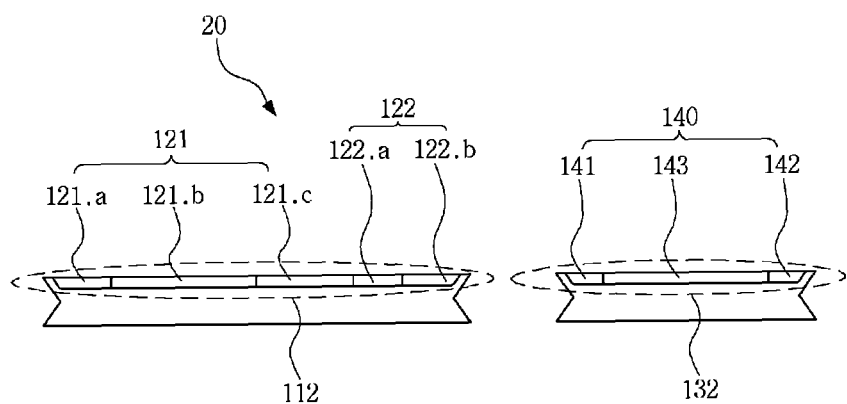
FIG. 9 is a cross-sectional view taken along the line A-A' of FIG. 8.

As illustrated in FIG. 8, the quenching resistor 140 of the silicon nanowire photomultiplier according to the second embodiment 20 of the present invention is configured such that the second silicon nanowire 132 is spaced apart from one end of the first silicon nanowire 112 at a predetermined interval in a longitudinal direction, and a P$^+$-type semiconductor region, a P-type semiconductor region and a P$^+$-type semiconductor region are sequentially formed in the longitudinal direction.

The quenching resistor 140 according to the second embodiment 20 is spaced apart from one end of the avalanche photodiode, which is formed of the first silicon nanowire 112, at a predetermined interval in the longitudinal direction. The quenching resistor 140 is formed by doping a P-type dopant, and the resistor region 143 is the P-type semiconductor region, and the electrode regions 141, 142 at both ends thereof are P$^+$-type semiconductor regions. Here, P$^+$ indicates a higher doping concentration than P.

The N$^+$-type semiconductor region 122.b or the P$^+$-type region 121.a of the first silicon nanowire 112 and the electrode regions 141, 142 of the quenching resistor 140 may be electrically connected by means of the electrode, and the avalanche photodiode using the silicon nanowire and the quenching resistor 140 may be connected in series, resulting in a circuit.

Figure 10:
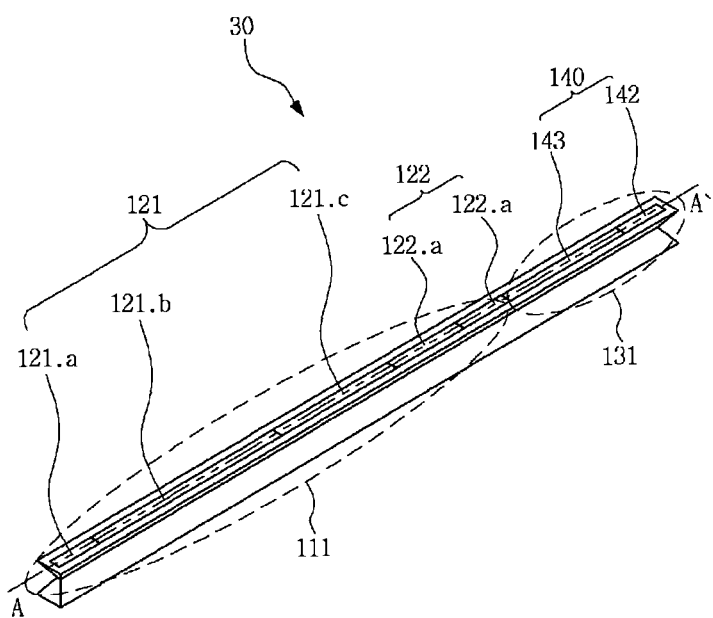
FIG. 10 illustrates a photomultiplier using a silicon nanowire, which includes an integrated quenching resistor, according to a third embodiment of the present invention.
Figure 11:
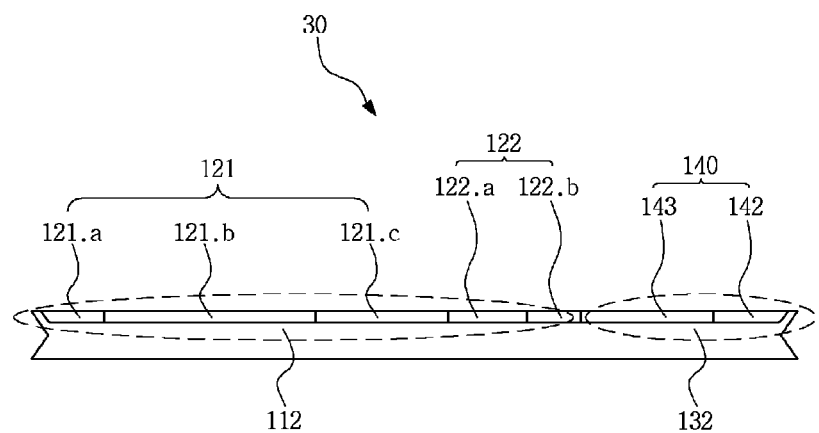
FIG. 11 is a cross-sectional view taken along the line A-A' of FIG. 10.

As illustrated in FIG. 10, the quenching resistor 140 of the silicon nanowire photomultiplier according to the third embodiment 30 of the present invention is configured such that the second silicon nanowire 132 is continuously formed in the longitudinal direction from one end of the first silicon nanowire 112, and an N-type semiconductor region and an N$^+$-type semiconductor region are sequentially formed in the longitudinal direction.

The quenching resistor 140 according to the third embodiment 30 is formed on the second silicon nanowire 132, which is continuously formed in the longitudinal direction of the first silicon nanowire 112, on which the avalanche photodiode is formed. The quenching resistor 140 is formed by doping an N-type dopant, and the resistor region 143 is an N-type semiconductor region, and the electrode region 142 is an N$^+$-type semiconductor region. Here, N' indicates a higher doping concentration than N. Since the first silicon nanowire and the second silicon nanowire are integratedly formed in the third embodiment 30, the electrode region 141 for connecting the avalanche photodiode and the quenching resistor is omitted, unlike the second embodiment 20.

The position of the quenching resistor 140 is not necessarily limited to those illustrated in the second embodiment and the third embodiment 30. The quenching resistor 140 may be formed parallel to the first silicon nanowire 112 on which the avalanche photodiode is formed, and thus silicon nanowire avalanche photodiodes and silicon nanowire quenching resistors 140 are alternately arrayed in the width direction of the silicon nanowire.

Silicon Nanowire Avalanche Photodiode Array (Fourth Embodiment)

Below is a description of a silicon nanowire avalanche photodiode array according to a fourth embodiment of the present invention, made with reference to other drawings, and any description which overlaps the description of the first embodiment 10 is omitted.

Figure 12A:
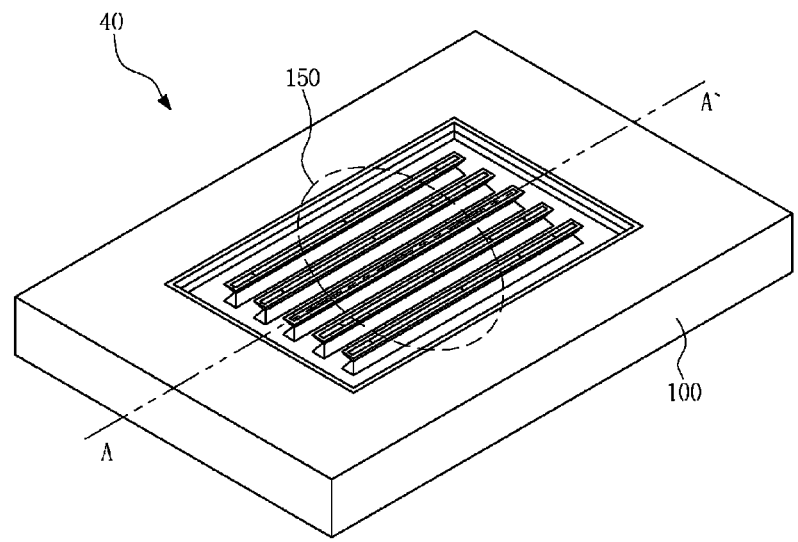
FIG. 12A is a perspective view illustrating a silicon nanowire avalanche photodiode according to a fourth embodiment of the present invention.
Figure 12B:
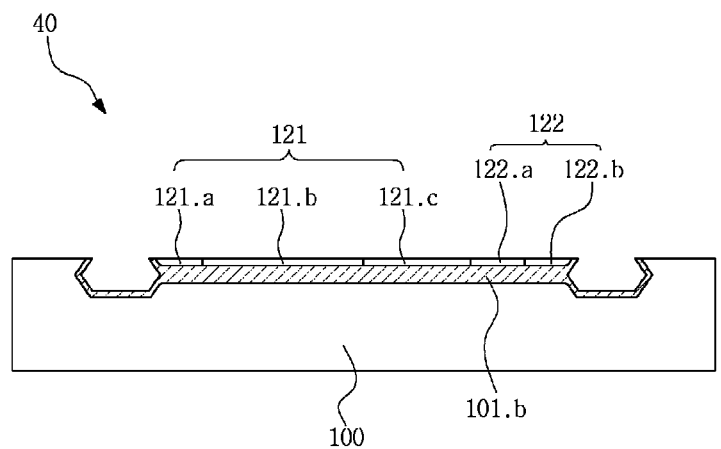
FIG. 12B is a cross-sectional view taken along the line A-A' of FIG. 12A.

FIG. 12A is a perspective view illustrating the silicon nanowire avalanche photodiode array according to the fourth embodiment of the present invention, and FIG. 12B is a cross-sectional view taken along the line A-A' of FIG. 12A.

With reference to FIG. 12A, the silicon nanowire avalanche photodiode array according to the fourth embodiment of the present invention includes an avalanche photodiode array 150 in which one or more avalanche photodiodes using silicon nanowires of the first embodiment 10 are spaced apart from each other at a predetermined interval in the width direction.

As in the avalanche photodiode using the silicon nanowire according to the first embodiment 10, first conductive regions 121 (P$^+$, P(i), P) and second conductive regions 122 (N, N$^+$) are formed continuously in the longitudinal direction. The length, width, and number of avalanche photodiodes and the interval between the avalanche photodiodes may vary depending on the design for the silicon nanowire avalanche photodiode array. Also, a plurality of avalanche photodiode arrays 150 may be provided on a single substrate 100.

Figure 13A:
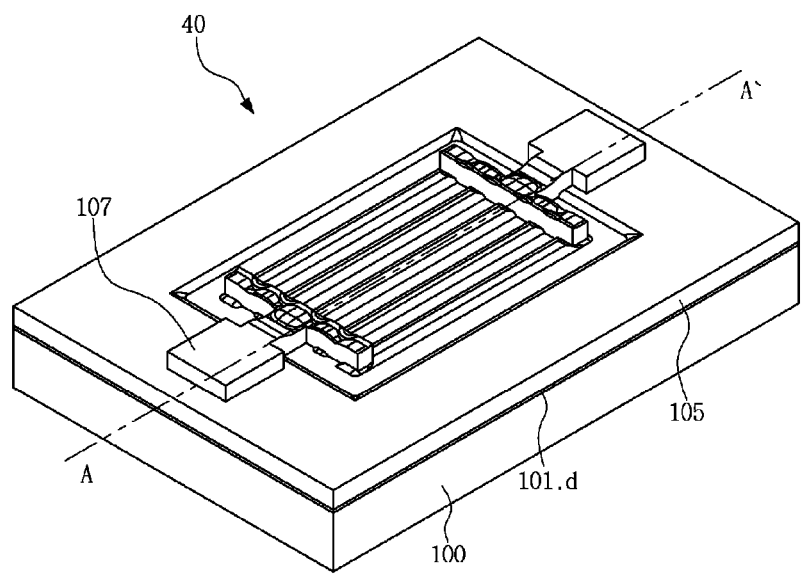
FIG. 13A is a perspective view illustrating a silicon nanowire avalanche photodiode including an electrode according to the fourth embodiment of the present invention.
Figure 13B:
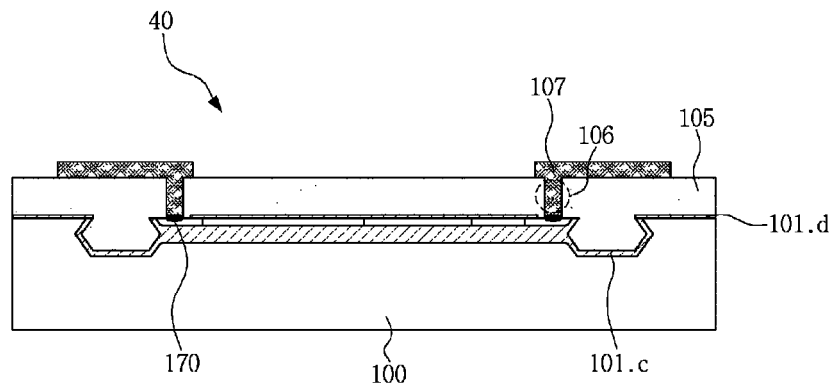
FIG. 13B is a cross-sectional view taken along the line A-A' of FIG. 13A.

FIG. 13A is a perspective view illustrating the silicon nanowire avalanche photodiode array including an electrode 107 according to the fourth embodiment of the present invention, and FIG. 13B is a cross-sectional taken along the line A-A' of FIG. 13A.

A silicide layer 170 is formed on the N$^+$-type semiconductor region 122.b and the P$^+$-type semiconductor region 121.a at both ends of each of the silicon nanowires. The silicide layer 170 functions to decrease contact resistance of the region where the silicon nanowire and the metal electrode 107 are connected to each other.

A first dielectric layer 105 is formed on the substrate 100 having the avalanche photodiode array 150. The first dielectric layer 105 is formed of a transparent insulating material, and functions to protect the avalanche photodiode array 150 and to electrically insulate the substrate 100 from the electrode 107. A contact hole 106 is formed in the first dielectric layer 105 so as to connect the electrode 107 to the silicide layer 170 of the N⁺-type semiconductor region 122.b and the P⁺-type semiconductor region 121.a at both ends of each of the avalanche photodiodes. The first dielectric layer 105 may be a silicon oxide film ($SiO_2$).

The electrode 107 is formed of a metal, and is electrically insulated from the substrate 100 by means of the first dielectric layer 105. The electrode 107 is formed through patterning and etching and functions to connect the avalanche photodiodes of the avalanche photodiode array 150 in parallel. The construction of the electrode 107 may be changed by the design and circuit configuration of the silicon nanowire avalanche photodiode. For example, one electrode 107 may be formed for each avalanche photodiode.

When one or more silicon nanowires are regularly spaced apart from each other at a predetermined interval in a width direction, it is easy to perform a doping process using different types of dopants having different concentrations in the longitudinal direction of the silicon nanowire, thereby increasing productivity. Also, since the thickness of the silicon nanowire is extremely small on the nano scale, the diffusion time of the doped dopant is very short, considerably reducing the processing time.

Silicon Nanowire Photomultiplier Including Quenching Resistor Array 160 (Fifth and Sixth Embodiments)

Below is a description of a silicon nanowire photomultiplier according to fifth and sixth embodiments of the present invention, made with reference to other drawings, and any description that overlaps the description of the fourth embodiment is omitted.

Figure 14A:
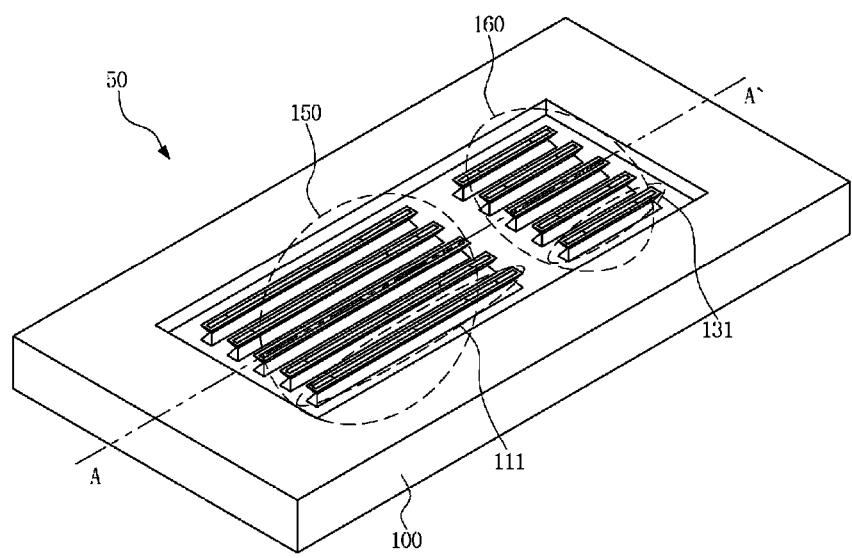
FIG. 14A is a perspective view illustrating a silicon nanowire photomultiplier including a quenching resistor array according to a fifth embodiment of the present invention.
Figure 14B:
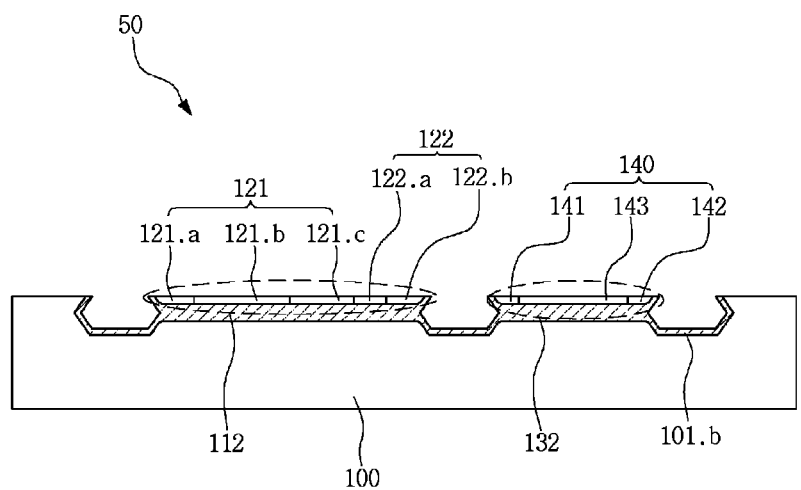
FIG. 14B is a cross-sectional view taken along the line A-A' of FIG. 14A.

FIG. 14A is a perspective view illustrating the silicon nanowire photomultiplier including a quenching resistor array 160 according to the fifth embodiment of the present invention, and FIG. 14B is a cross-sectional view taken along the line A-A' of FIG. 14A.

Figure 15A:
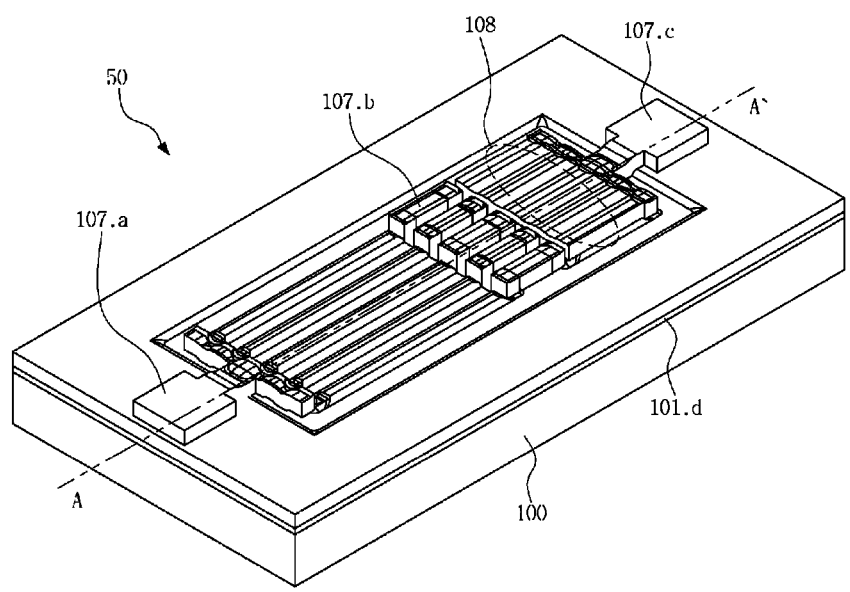
FIG. 15A is a perspective view illustrating the silicon nanowire photomultiplier including an electrode, as well as the quenching resistor array according to the fifth embodiment of the present invention.
Figure 15B:
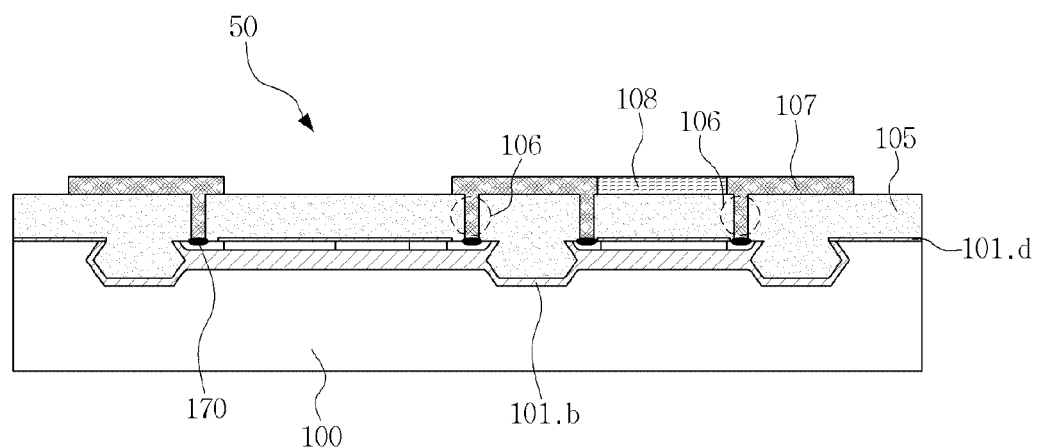
FIG. 15B is a cross-sectional view taken along the line A-A' of FIG. 15A.

FIG. 15A is a perspective view illustrating the silicon nanowire photomultiplier including an electrode 107 as well as the quenching resistor array 160 according to the fifth embodiment of the present invention, and FIG. 15B is a cross-sectional view taken along the line A-A' of FIG. 15A.

Figure 16A:
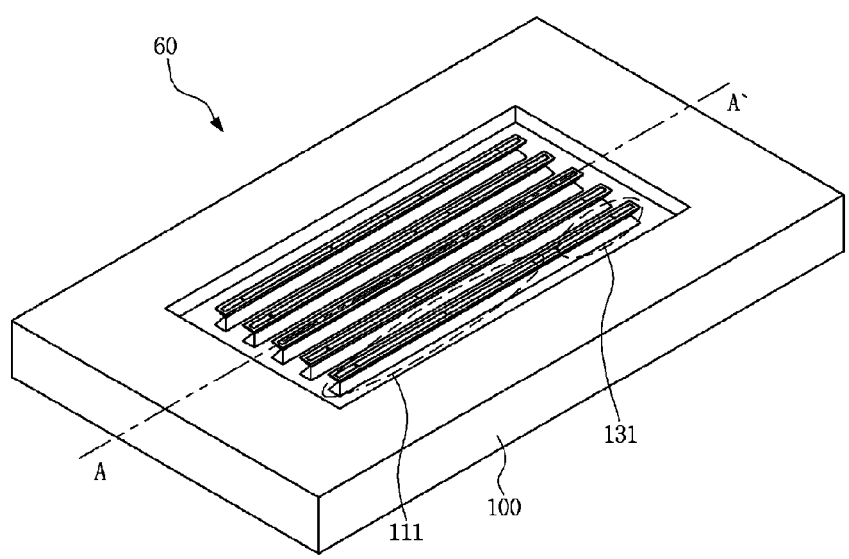
FIG. 16A is a perspective view illustrating the silicon nanowire photomultiplier including a quenching resistor array according to the sixth embodiment of the present invention.
Figure 16B:
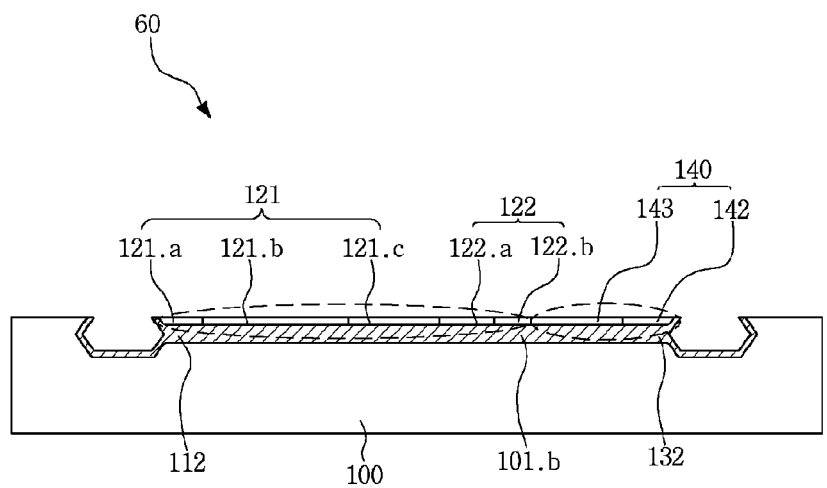
FIG. 16B is a cross-sectional view taken along the line A-A' of FIG. 16A.

FIG. 16A is a perspective view illustrating the silicon nanowire photomultiplier including a quenching resistor array 160 according to the sixth embodiment of the present invention, and FIG. 16B is a cross-sectional view taken along the line A-A' of FIG. 16A.

Figure 17A:
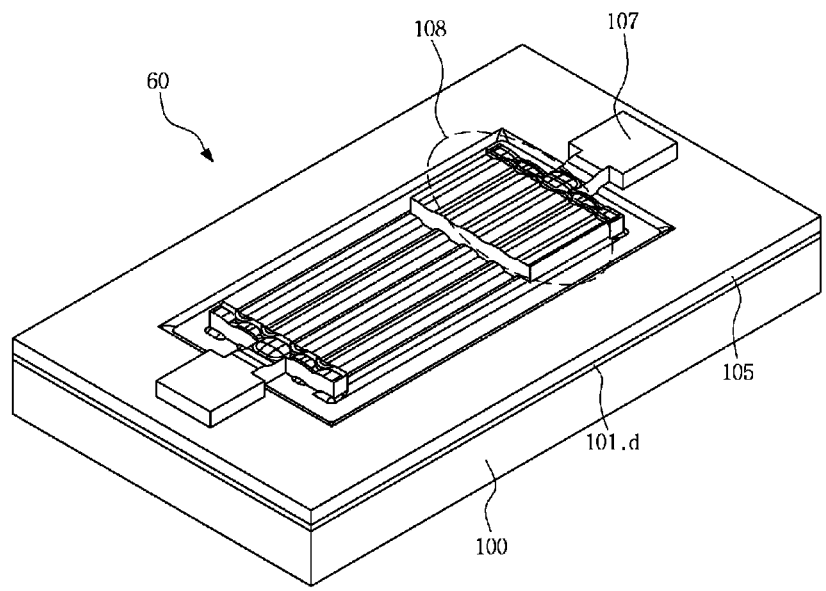
FIG. 17A is a perspective view illustrating the silicon nanowire photomultiplier including an electrode, as well as the quenching resistor array according to the sixth embodiment of the present invention.
Figure 17B:
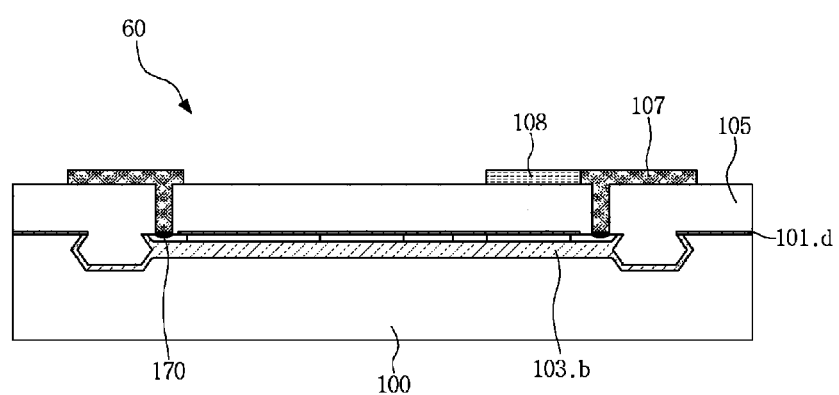
FIG. 17B is a cross-sectional view taken along the line A-A' of FIG. 17A.

FIG. 17A is a perspective view illustrating the silicon nanowire photomultiplier including an electrode 107 as well as the quenching resistor array 160 according to the sixth embodiment of the present invention, and FIG. 17B is a cross-sectional view taken along the line A-A' of FIG. 17A.

With reference to FIGS. 14A and 16A, the silicon nanowire photomultiplier according to the fifth and sixth embodiments of the present invention includes an avalanche photodiode array 150, in which one or more avalanche photodiodes using the nanowires according to the first embodiment 10 are spaced apart from each other at a predetermined interval in a width direction, and a quenching resistor array 160, in which one or more quenching resistors 140 formed of silicon (Si) are electrically connected to one end of the first silicon nanowire 112.

The quenching resistor array 160 is configured such that the quenching resistors 140 are doped with a P-type or N-type dopant.

The avalanche photodiode array 150 of the silicon nanowire photomultiplier according to the fifth and sixth embodiments is the same as that of the fourth embodiment. The quenching resistor array 160 includes one or more of the quenching resistors 140 disclosed in the second and third embodiments 20, 30.

The photodiode array 150 and the quenching resistor array 160 are formed on a single substrate 100, and the quenching resistor 140 is electrically connected to each of the avalanche photodiodes using the silicon nanowires included in the avalanche photodiode array 150.

Since the avalanche photodiode using the silicon nanowire has a nano-sized width, a very large number of avalanche photodiodes may be integrated in a given area. Accordingly, because the silicon nanowire photomultiplier is configured such that a large number of avalanche photodiodes may be integrated within a predetermined area, the size of the photomultiplier may be drastically reduced thanks to the use of the avalanche photodiodes using the silicon nanowires. As the size of the photomultiplier is decreased, more photomultipliers may be provided within a predetermined area, thereby increasing resolution. When such a photomultiplier is applied to a medical imaging system, improved image quality may be obtained even upon low exposure to X-rays or gamma-rays, compared to conventional semiconductor APD photomultipliers.

With reference to FIGS. 14A and 14B, the quenching resistor array 160 of the silicon nanowire photomultiplier according to the fifth embodiment of the present invention is spaced apart from one end of the avalanche photodiode array 150 at a predetermined interval in a longitudinal direction, and the quenching resistor 140 is configured such that a P⁺-type semiconductor region, a P-type semiconductor region and a P⁺-type semiconductor region are sequentially formed in the longitudinal direction.

A silicide layer 170 is formed on the N⁺-type and P⁺-type regions 121.a, 122.b, 141, 142 at both ends of each of the silicon nanowires. The silicide layer 170 functions to decrease contact resistance of the region where the nanowire made of silicon is connected to the electrode 107 made of a metal.

With reference to FIGS. 15A and 15B, the silicon nanowire photomultiplier including the electrode 107 according to the fifth embodiment of the present invention is configured such that a first dielectric layer 105 is formed on a substrate 100 that includes a photodiode array 150 and a quenching resistor array 160. The first dielectric layer 105 is made of a transparent insulating material, and plays a role in protecting the avalanche photodiode array 150 and the quenching resistor array 160 and in electrically insulating the substrate 100 from the electrode 107. A contact hole 106 is formed in the first dielectric layer 105 so as to interconnect the silicide layer 170 of the N⁺-type semiconductor region 122.b and the P⁺-type semiconductor region 121.a at both ends of each of the avalanche photodiodes, the silicide layer 170 of the electrode regions 141, 142 of each of the quenching resistors 140, and the electrode 107. The first dielectric layer 105 may be a silicon oxide film ($SiO_2$).

Figure 15C:
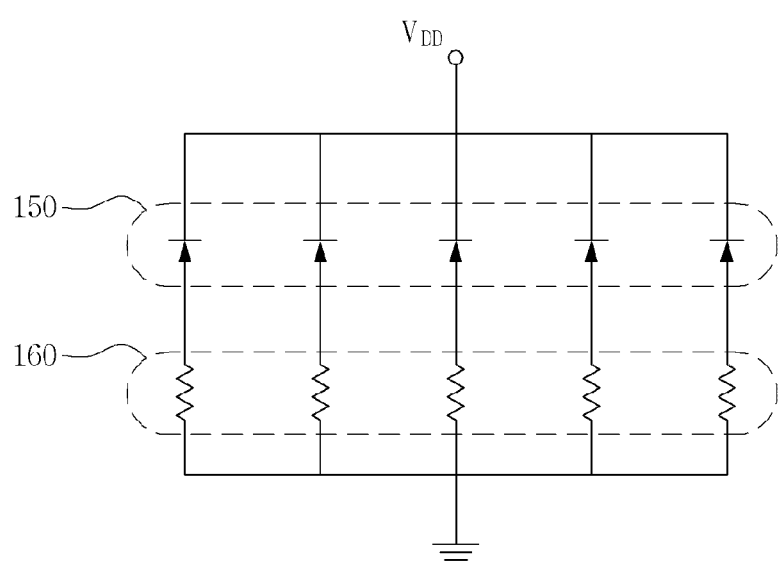
FIG. 15C is a circuit diagram of the silicon nanowire photomultiplier according to the fifth and sixth embodiments of the present invention.

The electrode 107 is formed of a metal, and is electrically insulated from the substrate 100 by means of the first dielectric layer 105. The electrode 107 is formed to have a predetermined construction through patterning and etching. The first electrode 107.a functions to connect the avalanche photodiodes of the avalanche photodiode array 150 in parallel. The second electrode 107.b functions to connect the avalanche photodiodes of the avalanche photodiode array 150 and the quenching resistors 140 in series, and one second electrode is formed for each avalanche photodiode and for each quenching resistor 140. The third electrode 107.*c* functions to connect the quenching resistors 140 in parallel. By virtue of the construction of the electrode 107, the circuit structure shown in FIG. 15C is obtained. The construction of the electrode 107 is not limited to the present embodiment.

A light-shielding film 108 is further formed on the quenching resistor array 160 between the second electrode 107b and the third electrode 107c. The light-shielding film 108 functions to prevent the incidence of photons on the quenching resistor 140 and to prevent the resistance value of the quenching resistor 140 from changing due to the incidence of photons on the quenching resistor 140. In the present embodiment, this film is formed of an opaque material having a predetermined thickness, and has the overall form of a planar shape, but is not limited thereto.

With reference to FIGS. 16A and 16B, the quenching resistor array 160 of the silicon nanowire photomultiplier according to the sixth embodiment of the present invention is formed continuously in the longitudinal direction from one end of the avalanche photodiode array 150, and the quenching resistor 140 is configured such that the N-type semiconductor region and the $N^+$-type semiconductor region are sequentially formed in the longitudinal direction.

Since the nanowire photodiode and the quenching resistor 140 are formed on a single nanowire, when the silicon nanowires are connected in parallel by the electrode 107, the circuit structure as shown in FIG. 15C is obtained.

The first to the sixth embodiments of the present invention are as described above, and the method of manufacturing the silicon nanowire avalanche photodiode according to the fourth embodiment is described below. The following manufacturing method may be applied regardless of the number of silicon nanowires, and enables simultaneous formation of the avalanche photodiode and the quenching resistor 140 using the silicon nanowire.

Method of Manufacturing Silicon Nanowire Avalanche Photodiode

Below is a description of a method of manufacturing the silicon nanowire avalanche photodiode according to the present invention, made with reference to other drawings. The same reference numerals designate the same or similar elements.

The method of manufacturing the silicon nanowire avalanche photodiode includes:
  (A) etching a silicon (Si) substrate to form a plurality of column structures 104 which are spaced apart from each other at a predetermined interval, and performing anisotropic wet etching of a lateral surface of each of the column structures 104, thus forming a first hourglass-shaped silicon nanowire structure 111;
  (B) forming an oxide film on the surface of the first hourglass-shaped silicon nanowire structure 111 by oxidizing the surface of each of the first silicon nanowire structure, thus forming a first silicon nanowire 112 at the upper portion of the first silicon nanowire structure 111;
  (C) doping the first silicon nanowire 112 with different types of dopants, thus forming a first conductive region 121 and a second conductive region 121, which are arranged continuously in the longitudinal direction of the first silicon nanowire 112, thereby forming an avalanche photodiode array 150 using a silicon nanowire;
  (D) depositing a metal on the P+-type semiconductor region 121.*a* and the N+-type semiconductor region 122.*b* of the avalanche photodiode array 150 and performing thermal treatment, thus forming a silicide layer 170; and
  (E) forming an electrode, which is insulated from the substrate 100 and are connected to the silicide layer 170.

Specifically, (A) includes:
  (A1) sequentially layering a silicon oxide film and a silicon nitride film on the substrate 100 and subjecting the substrate to dry etching to a predetermined depth, thus forming a plurality of column structures 104; and
  (A2) subjecting the lateral surface of each of the column structures 104 to anisotropic wet etching, thus forming a first hourglass-shaped silicon nanowire structure 111.

Figure 18A:
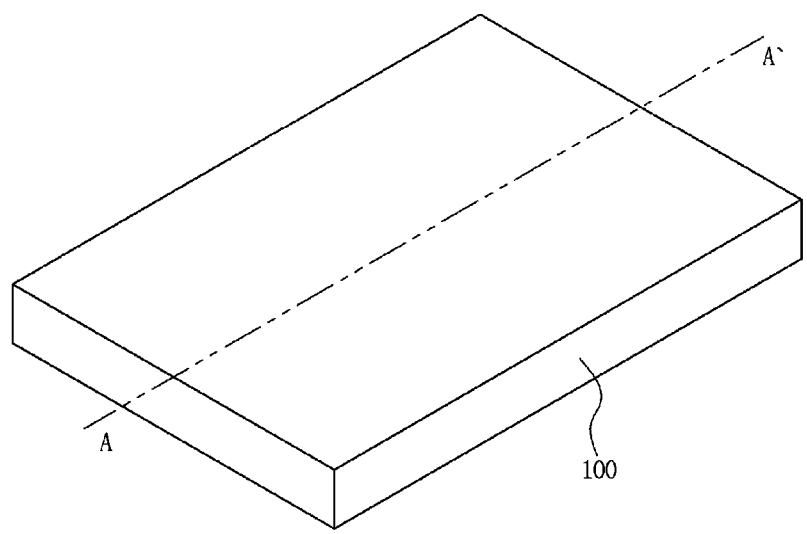
FIG. 18A illustrates the preparation of a substrate for manufacturing the silicon nanowire avalanche photodiode according to the fourth embodiment of the present invention.
Figure 18B:
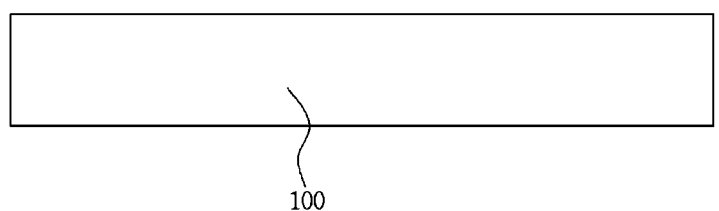
FIG. 18B is a cross-sectional view taken along the line A-A' of FIG. 18A.

With reference to FIGS. 18A and 18B, a silicon substrate 100 having a Miller index (100) crystal direction is prepared. The Miller index is used to determine the silicon crystal direction.

Figure 19A:
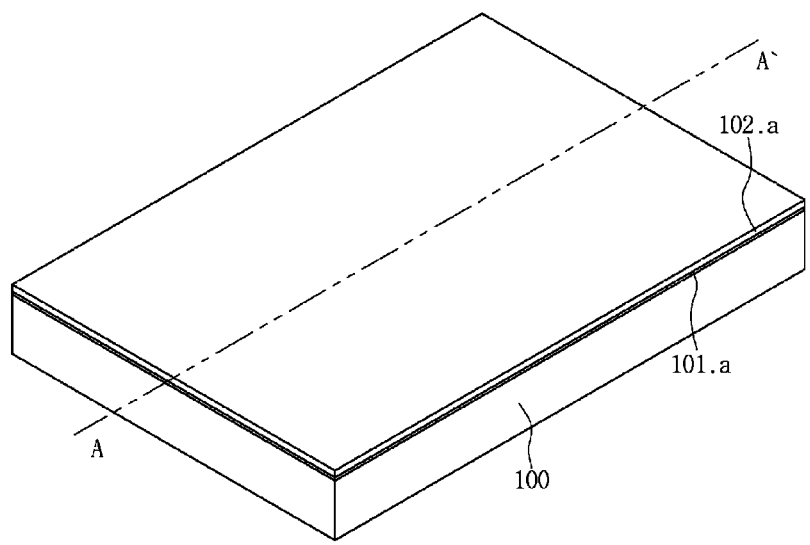
FIG. 19A illustrates the sequential deposition of a silicon oxide film and a silicon nitride film on one surface of the substrate of FIG. 18A.
Figure 19B:
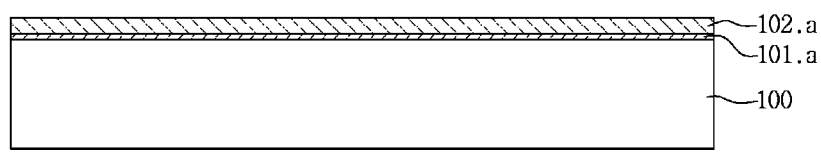
FIG. 19B is a cross-sectional view taken along the line A-A' of FIG. 19A.

Next, with reference to FIGS. 19A and 19B, a first silicon oxide film ($SiO_2$) 101.*a* is formed to a predetermined thickness through dry oxidation, and a first silicon nitride film ($Si_3N_4$) 102.*a* is sequentially formed through low-pressure chemical vapor deposition (LPCVD).

Dry oxidation is a process of reacting oxygen ($O_2$) gas on a silicon (Si) substrate to form a silicon oxide film ($SiO_2$). The silicon oxide film ($SiO_2$) is an electrical insulator, and is used as a mask for an etching process.

Low-pressure chemical vapor deposition is a process of forming a thin film through chemical vapor deposition at a low pressure (about 0 to 2 torr). Low-pressure chemical vapor deposition is advantageous because a large number of wafers may be processed together, and superior step coverage and uniformity may be exhibited.

Figure 20A:
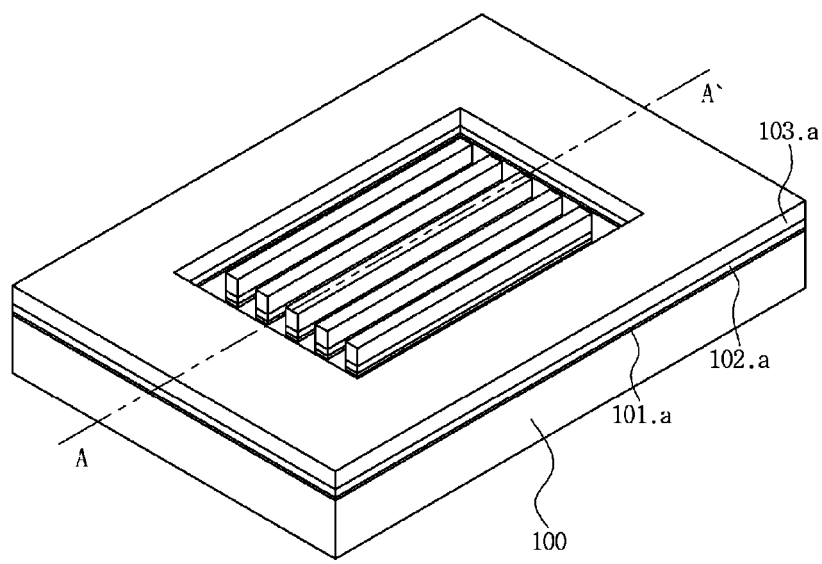
FIG. 20A illustrates the photolithography and etching of one surface of the substrate of FIG. 19A so as to expose the silicon substrate.
Figure 20B:
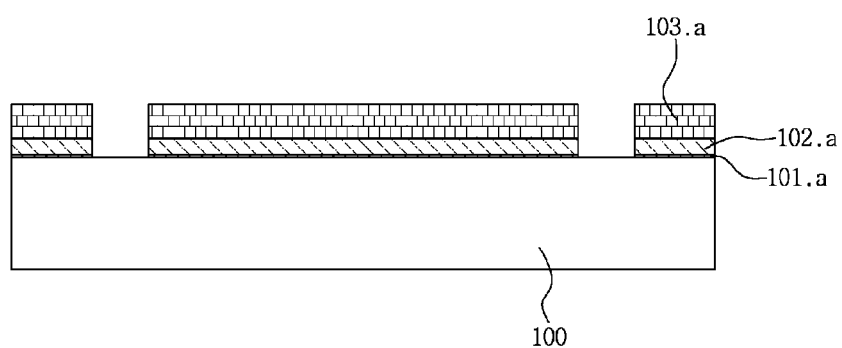
FIG. 20B is a cross-sectional view taken along the line A-A' of FIG. 20A.

Next, with reference to FIGS. 20A and 20B, a first photoresist 103.*a* is applied on the first silicon nitride film 102.*a*, followed by photolithography, thus forming a predetermined pattern.

The photolithography is carried out in such a manner that a photoresist is applied on the surface of a substrate, a mask pattern image is transferred to the photoresist through exposure, and development, in which the photoresist corresponding to the portion to be etched is removed to form a pattern image, is performed. The photoresist remaining after removal of the portion of the photoresist is used as a mask in subsequent processing (etching, etc.).

In order to form five first nanowires 112 in the present embodiment, as illustrated in FIG. 20A, line patterns having a predetermined width, suitable for use in forming five column structures having a rectangular cross-section, are formed. Each of the line patterns has a rectangular cross-section with a predetermined width and length. The line patterns are spaced apart from each other at a predetermined interval in the width direction. The first photoresist 103.*a* that remains after photolithography is used as the mask for a subsequent dry etching process. After formation of the line patterns, the first silicon nitride film 102.*a* and the first silicon oxide film 101.*a*, which are exposed to the surface, are sequentially dry-etched, and the silicon of the substrate 100 is exposed.

Figure 21A:
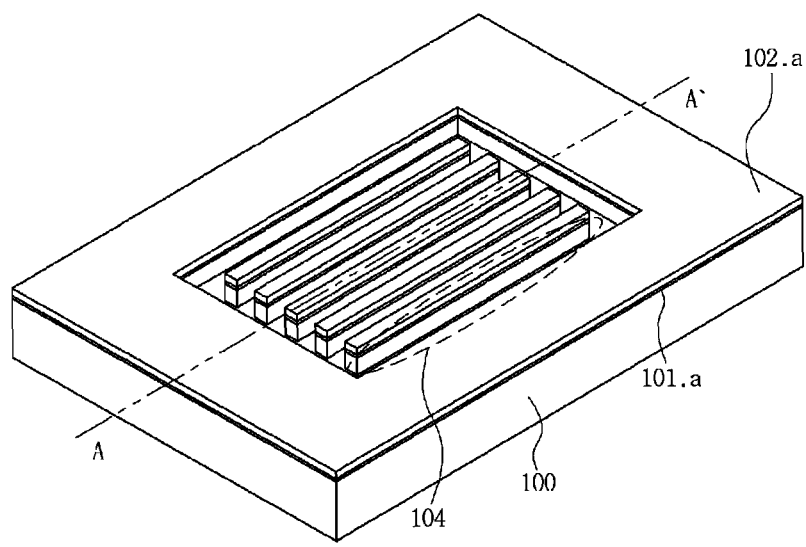
FIG. 21A illustrates the etching of the exposed silicon substrate of FIG. 20A and the removal of the photoresist to form a column structure.
Figure 21B:
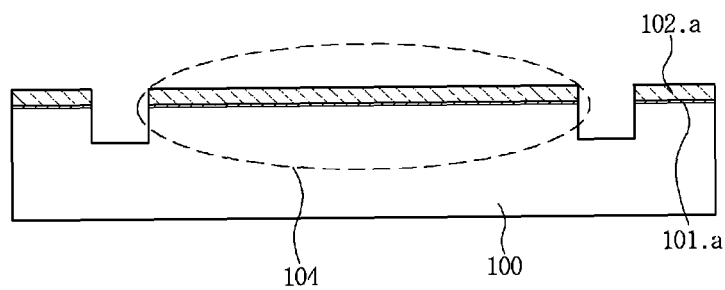
FIG. 21B is a cross-sectional view taken along the line A-A' of FIG. 21A.

Next, with reference to FIGS. 21A and 21B, the portion of the substrate 100, to which silicon is exposed, is dry-etched to a predetermined depth, and the first photoresist 103.*a* is removed. As illustrated in FIG. 21A, the silicon substrate 100 is etched to a predetermined depth, thereby forming five column structures 104 made of silicon and having a rectangular cross-section on the substrate 100.

Figure 22A:
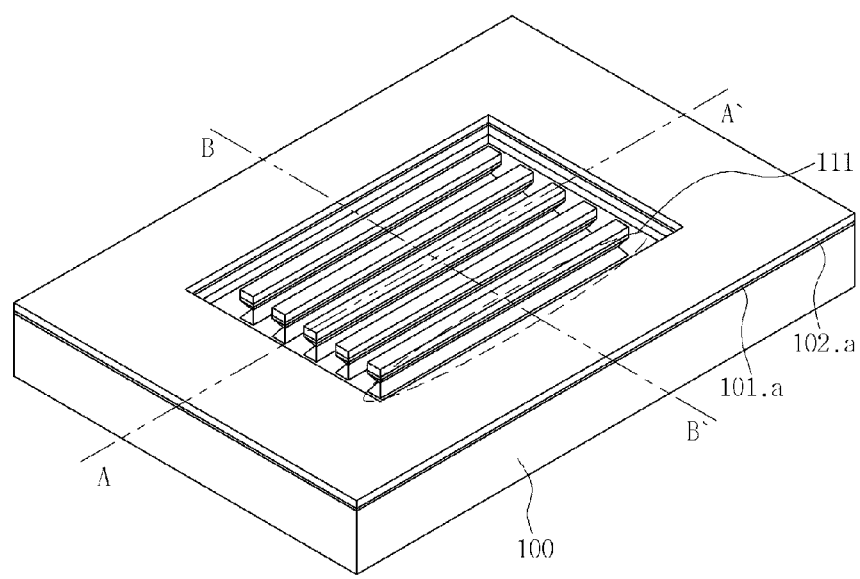
FIG. 22A illustrating the formation of the column structure of FIG. 21A into an hourglass-shaped structure through an anisotropic wet etch process.
Figure 22B:
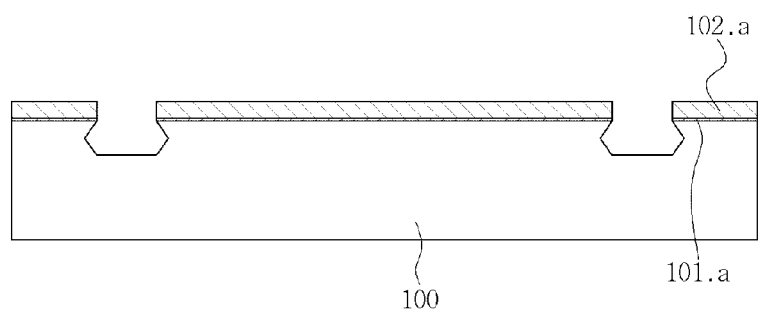
FIG. 22B is a cross-sectional view taken along the line A-A' of FIG. 22A.
Figure 22C:
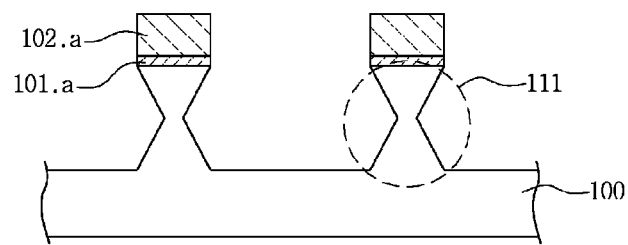
FIG. 22C is a cross-sectional view taken along the line B-B' of FIG. 22A.

Next, with reference to FIGS. 22A to 22C, the substrate 100 is cleaned using an SPM (Sulfuric Peroxide Mixture) solution, and the substrate 100, cleaned for wet etching, is immersed in a BOE (Buffered Oxide Etch) solution for a predetermined time (e.g. about 5 sec), thus removing a native oxide film. Subsequently, the silicon substrate 100 is subjected to anisotropic etching using a KOH solution (or a TMAH solution—about 80° C. for about 15 sec). After completion of the wet etching, each of the column structures 104 of the silicon substrate 100 is formed into a hourglass-shaped silicon structure of a first silicon nanowire structure 111 in which a (111) crystal plane of silicon meets as shown in FIG. 22C due to anisotropic etching characteristics, based on the difference in etching rate according to the silicon crystal direction.

Next, with reference to FIGS. 23A to 23C, after completion of the wet etching of silicon, SPM cleaning and wet oxide film formation processes are performed. When the hourglass-shaped silicon structure of the first silicon nanowire structure 111 is subjected to wet oxide film formation, the silicon region exposed to the surface thereof reacts, thereby forming a second silicon oxide film 101.b on the surface of the hourglass-shaped silicon structure of the first silicon nanowire structure 111. In the course of forming the second silicon oxide film 101.b, as illustrated in FIG. 23C, the first silicon nanowire 112 is formed at the upper portion of the first silicon nanowire structure 111. The cross-section of the first silicon nanowire 112 has an inverted triangular shape, and has the same inner angle θ as the angle defined by the upper surface and the lateral surface of the first silicon nanowire structure 111.

In the method of manufacturing the silicon nanowire according to the present invention, a plurality of silicon nanowires having a uniform width and length may be formed by carrying out a wet oxide film formation process once, without additional processing. Since the oxide film around the silicon nanowire has insulating properties, the need to form an additional insulator is obviated, thus simplifying the manufacturing process.

The first silicon nanowire 112 obtained thus is electrically insulated from the substrate 100 by the silicon oxide film (SiO$_2$) (the silicon oxide film of the first silicon nanowire structure 111) around the first silicon nanowire 112. The thickness of the first silicon nanowire 112 may be controlled by adjusting the thickness of the oxide film.

Here, some modifications in which the silicon nanowire is formed to a desired thickness (width) are described with reference to the following Equations 4 to 5 and FIG. 23D.

$$a = W - 2*0.45*T*((1+\cos(54.74°))/(\sin(54.74°))) \quad \text{[Equation 4]}$$

$$T = (W-a)/0.9*)(\sin(54.74°))/(1+\cos(54.74°)) \quad \text{[Equation 5]}$$

(wherein a is the width of a silicon nanowire, W is the width of the upper surface of a silicon nanowire structure, and T is the thickness of an oxide film)

FIG. 23D illustrates the cross-section of the silicon nanowire structure resulting from a wet oxide film formation process in the presence of silicon nitride 102.a and the first silicon oxide film 101.a on the hourglass-shaped silicon nanowire structure formed through wet etching of the column structure 104. The silicon nitride film has such a dense molecular structure that water molecules cannot pass therethrough. Hence, in the wet oxide film formation process, the oxide film is formed only on the lateral surface of the silicon nanowire structure, but not on the upper surface thereof. Thus, the silicon nanowire is formed on the upper surface of the upper portion of the silicon nanowire structure. In this case, the desired thickness of the silicon nanowire and the thickness of the oxide film are represented by Equation 5. When the silicon nitride film is removed, the silicon nanowire is directly exposed to the surface, and thus there is no need for additional processing.

The inner angle(θ1) defined by the upper surface and the lateral surface of the silicon nanowire is the same as the inner angle(θ2) defined by the upper surface and the lateral surface of the upper portion of the silicon nanowire structure because the oxide film is formed at the same rate on all of the surfaces in the wet oxide film formation process. Thus, in order to adjust the width, length and depth of the silicon nanowire, the width, length and depth of the silicon nanowire structure may be controlled in consideration of the thickness of the oxide film to be formed.

Next, the formation of the photodiode by doping the silicon nanowire with the dopant is described. Specifically, (C) includes:

(C1) doping a predetermined portion of the first silicon nanowire 112 with a first dopant, thus forming a first region 112.a;

(C2) doping a predetermined portion of the first region 112.a with a second dopant having a conductive type different from that of the first dopant, thus forming a second region 112.b;

(C3) doping a predetermined portion 112.c of the second region 112.b with the second dopant, thus forming an N+-type semiconductor region 122.b; and (C4) doping the remaining portion 112.d of the first silicon nanowire with the first dopant, thus forming a P+-type semiconductor region 121.a, thereby obtaining a photodiode array using a silicon nanowire.

Figure 24A:
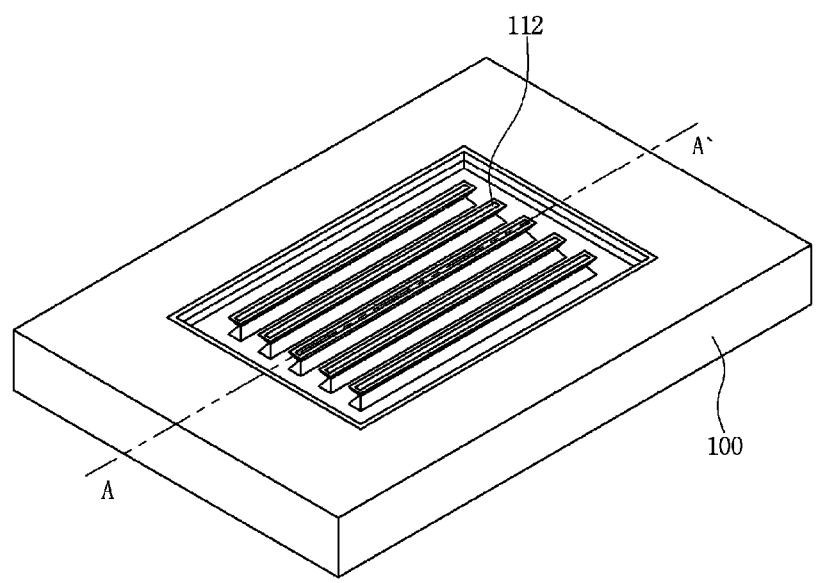
FIG. 24A illustrates the removal of the silicon nitride film and the silicon oxide film of FIG. 23A.
Figure 24B:
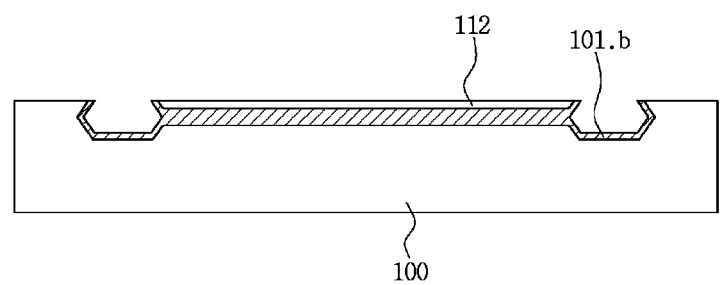
FIG. 24B is a cross-sectional view taken along the line A-A' of FIG. 24A.

With reference to FIGS. 24A and 24B, the first silicon nitride 102.a and the first silicon oxide film 101.a are sequentially removed from the substrate 100 after the formation of the first silicon nanowire. The silicon nitride film is removed using a phosphoric acid (H3PO4) solution, and the silicon oxide film is removed using a diluted hydrofluoric acid (HF) solution. In this procedure, particles generated during the etching process or the oxide film formation process are removed, and thus the surface of the substrate 100 exposed to the outside is made clean. The period of time required to remove the oxide film has to be adjusted so that the second silicon oxide film 101.b on the lateral surface of the first silicon nanowire structure 111, obtained by the wet oxide film formation process for forming the first silicon nanowire 112, is not completely removed.

Figure 25A:
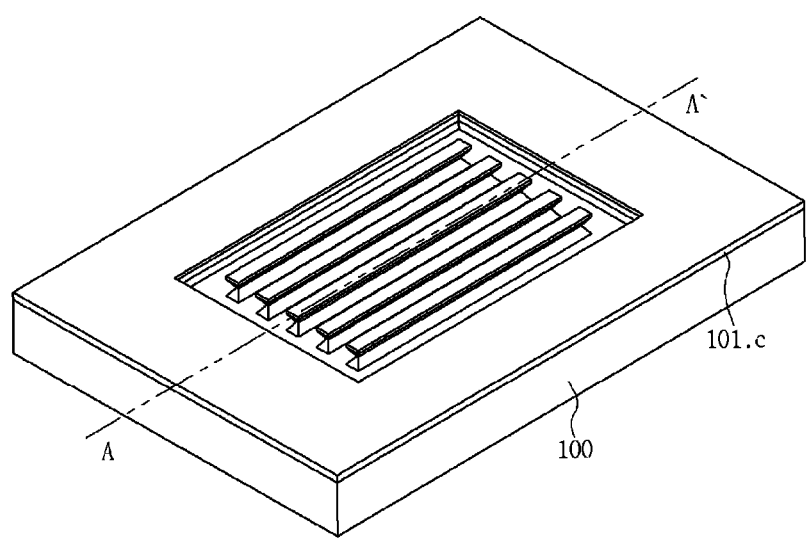
FIG. 25A illustrates the formation of the silicon oxide film on the substrate of FIG. 24A.
Figure 25B:
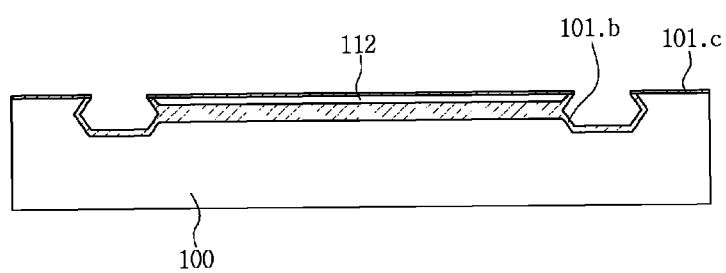
FIG. 25B is a cross-sectional view taken along the line A-A' of FIG. 25A.

Next, with reference to FIGS. 25A and 25B, a third silicon oxide film 101.c is formed on the substrate 100 having the clean surface. The silicon oxide film is formed on the silicon nanowire such that the dopant does not pass through the nanowire via the silicon crystal but is implanted into the upper portion of the silicon nanowire. Subsequent thermal treatment is required in order to diffuse the dopant implanted into the upper portion of the silicon nanowire.

Figure 26A:
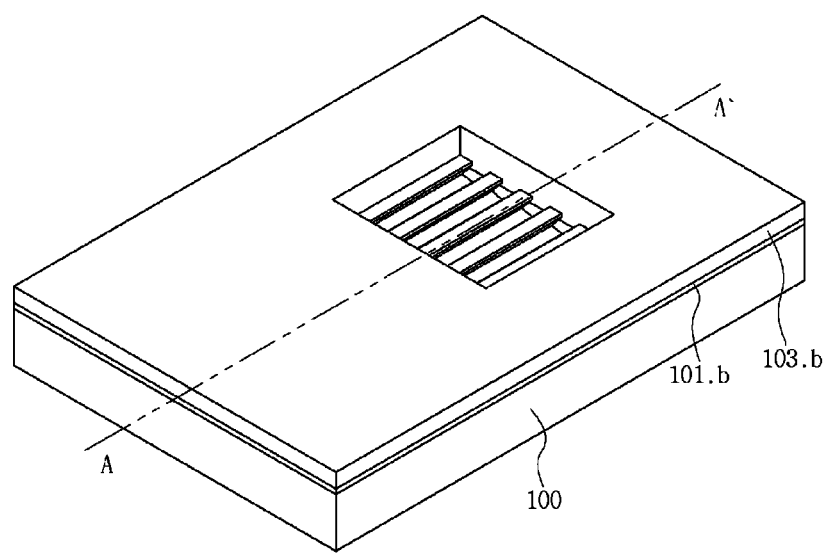
FIG. 26A illustrates the exposure of a portion of the silicon nanowire on the substrate of FIG. 25A through photolithography, and the doping of a first dopant.
Figure 26B:
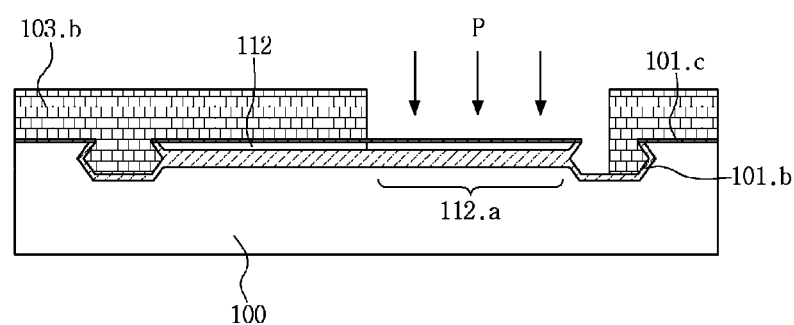
FIG. 26B is a cross-sectional view taken along the line A-A' of FIG. 26A.

Next, with reference to FIGS. 26A and 26B, in order to form the conductive region on the first silicon nanowire 112, a second photoresist 103.b is formed on the substrate 100 and is then patterned through photolithography so as to expose a desired doping region of the first silicon nanowire 112. In the present embodiment, the doping region is the first region 112.a, ranging from one side of the first silicon nanowire 112 to a predetermined region, and the first dopant is a P-type dopant (boron). The first region 112.a is doped with a P-type dopant, thus forming a P-type semiconductor region 121.c (FIG. 30B).

Figure 27A:
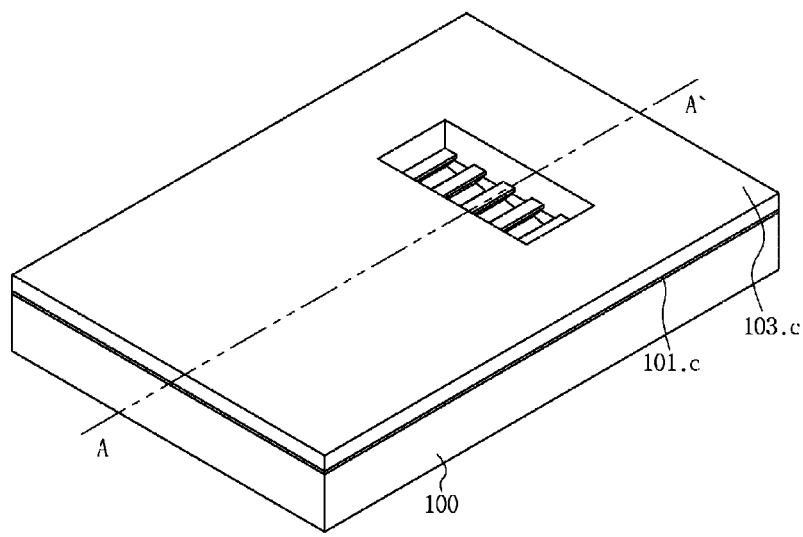
FIG. 27A illustrates the exposure of a portion of the silicon nanowire on the substrate of FIG. 26A through photolithography, and the doping of a second dopant.
Figure 27B:
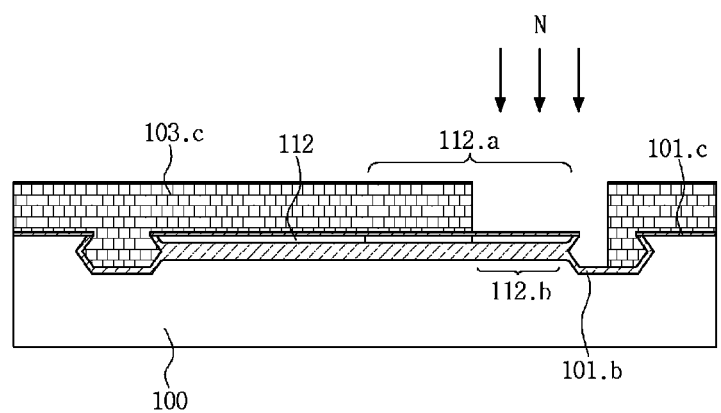
FIG. 27B is a cross-sectional view taken along the line A-A' of FIG. 27A.

Next, with reference to FIGS. 27A and 27B, in order to dope a portion of the first region 112.a of the first silicon nanowire with a different conductive type dopant, a third photoresist 103.c is formed on the substrate 100 and is then patterned through photolithography so as to expose a desired doping region of the first silicon nanowire 112. The doping region is the second region 112.b, ranging from one side of the first region 112.a to a predetermined region, and the second dopant is an N-type dopant (P, As). The second region 112.b of the first silicon nanowire 112 is doped with an N-type dopant, thus forming an N-type semiconductor region 122.a (FIG. 30B). In this procedure, an N-type dopant is implanted at a higher concentration than that of a P-type dopant into the portion 112.b of the first region 112.a into which the P-type dopant is implanted, whereby the portion of the region 112.a, doped with the P-type dopant, is formed into an N-type semiconductor region 122.a.

By (C1) and (C2) as shown in FIGS. 26A to 27B, a boundary is formed between the P-type conductive region (the first conductive region 121) and the N-type conductive region (the second conductive region 122) on the first silicon nanowire 112. In (C1) and (C2), when the doping regions are continuously formed in a longitudinal direction on the first silicon nanowire 112, an intrinsic semiconductor region (i), which is not doped, is prevented from being formed at the boundary between the doping regions. The region near the boundary is the region where avalanche multiplication occurs due to the generation of the strongest electric field when a reverse bias voltage is applied to the silicon nanowire photodiode.

Figure 28A:
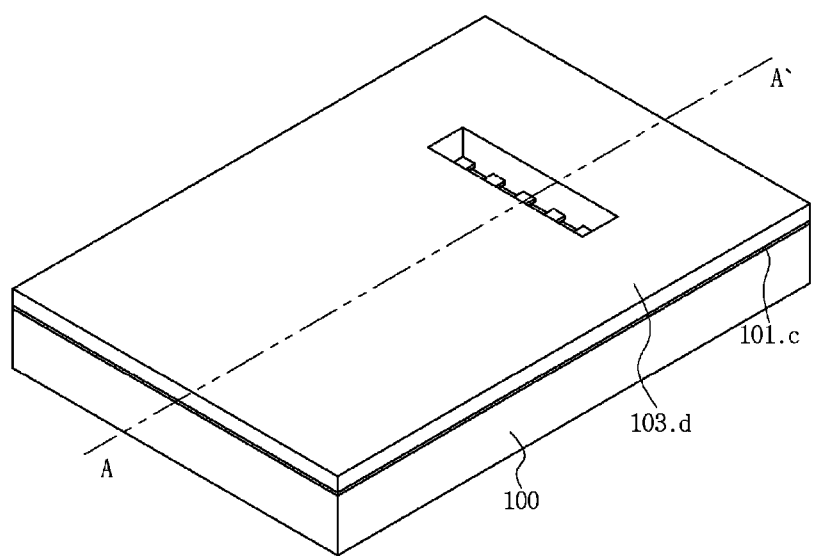
FIG. 28A illustrates the exposure of a portion of the silicon nanowire on the substrate of FIG. 27A through photolithography, and the doping of a second dopant.
Figure 28B:
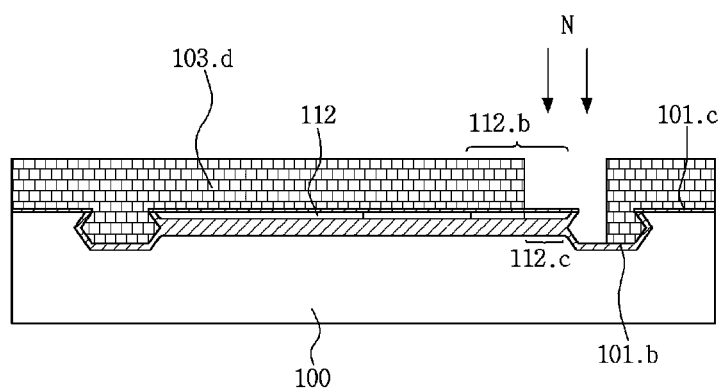
FIG. 28B is a cross-sectional view taken along the line A-A' of FIG. 28A.

Next, with reference to FIGS. 28A and 28B, in order to make a region for forming the electrode 107 on a portion of the N-type semiconductor region 122.a of the first silicon nanowire 112, a fourth photoresist 103.d is formed on the substrate 100 and is then patterned through photolithography so as to expose a desired doping region of the first silicon nanowire 112. The doping region is the third region 112.c, which ranges from one side of the N-type semiconductor region 122.a (FIG. 30B) to a predetermined region, and is doped with an N-type dopant of the same conductive type. The third region 112.c is doped with an N-type dopant to thus form an N-type semiconductor region 122.b (FIG. 30B). Here, N$^+$ means doping with an N-type dopant at a higher concentration than that of the N-type semiconductor region 122.a (FIG. 30B).

Figure 29A:
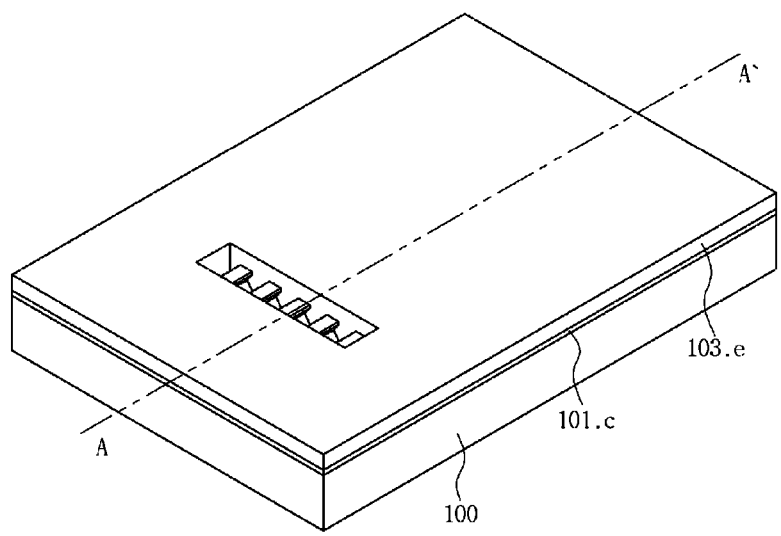
FIG. 29A illustrates the exposure of a portion of the silicon nanowire on the substrate of FIG. 28A through photolithography, and the doping of a first dopant.
Figure 29B:
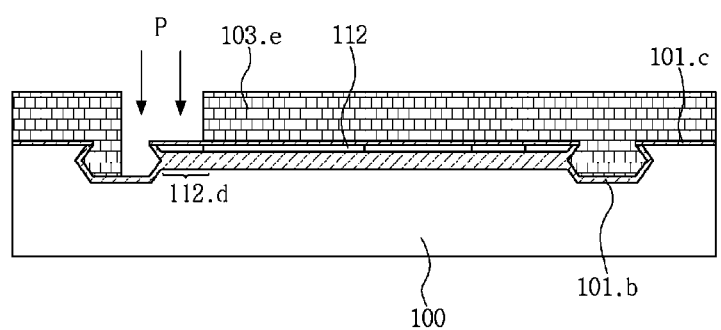
FIG. 29B is a cross-sectional view taken along the line A-A' of FIG. 29A.

Next, with reference to FIGS. 29A and 29B, in order to make a region for forming the electrode 107 on the remaining side of the first silicon nanowire 112, a fifth photoresist 103.e is formed on the substrate 100 and is then patterned through photolithography so as to expose a desired doping region of the first silicon nanowire 112. The doping region is the fourth region 112.d, ranging from the remaining side of the first silicon nanowire 112 to a predetermined region, and is doped with a P-type dopant. The fourth region 112.d is doped with a P-type dopant to thus form a P$^+$-type semiconductor region 121.a (FIG. 30B). Here, P$^+$ means doping with a P-type dopant at a higher concentration than that of the P-type region 121.c (FIG. 30B).

In the aforementioned doping process, the concentration of the dopant, the position and length of the doping region, the doping time, and the doping sequence may vary depending on the design for the photodiode to be formed on the silicon nanowire, and the first dopant may be of an N-type, and the second dopant may be of a P-type. In the present embodiment, the position and range of the first to the fourth regions may vary, and the doping sequence may be set differently depending on the process.

Figure 30A:
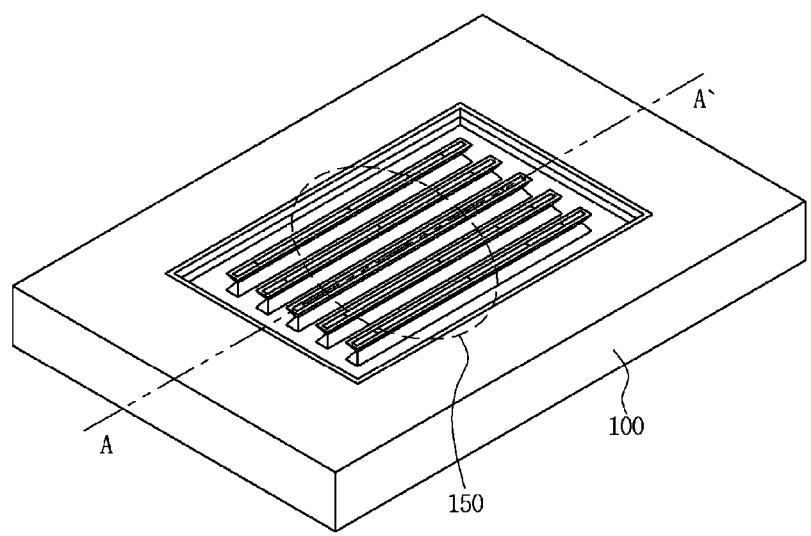
FIG. 30A illustrates the diffusion of the dopant implanted into the silicon nanowire through annealing.
Figure 30B:
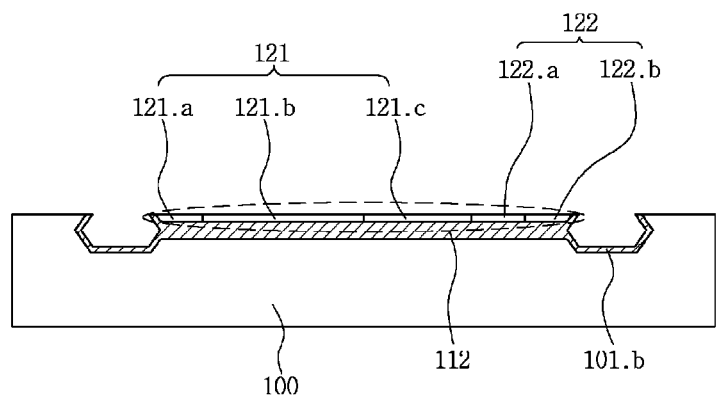
FIG. 30B is a cross-sectional view taken along the line A-A' of FIG. 30A.

Next, with reference to FIGS. 30A and 30B, the third silicon oxide film 101.c is removed, and the dopant-doped first silicon nanowire 112 is thermally treated (annealed) to thus diffuse the dopant.

In the annealing process, the dopant added through ion implantation is activated within the silicon substrate 100, and the silicon substrate 100, which is damaged upon ion implantation, is recrystallized. The annealed silicon nanowire may be made to function as a photodiode by diffusing and activating the doped dopant within the silicon nanowire.

In the present embodiment, the dopant implanted into the silicon nanowire is diffused using RTA (Rapid Thermal Annealing). The substrate 100 having the silicon nanowire is heated to a high temperature (about 1000° C.) within a short time equal to or less than ones of seconds and slowly cooled, whereby the dopant implanted into the nanowire is diffused throughout the silicon nanowire and activated. This may be applied to the other embodiments.

In (C), set forth above, the first silicon nanowires 112 are simultaneously doped with the dopant and then annealed, thus forming an avalanche photodiode array 150.

Next, the formation of the silicide layer 170 and the electrode 107 on the avalanche photodiode array 150 is described below.

Specifically, (D) includes:

(D1) forming an oxide film on the avalanche photodiode array 150 and performing patterning and etching, thus removing the oxide film from the P+-type semiconductor region 121.a and the N+-type semiconductor region 122.b;

(D2) depositing a metal layer on the avalanche photodiode array 150 and heating it to a first temperature, thus forming a first silicide layer 170 on the P+-type semiconductor region 121.a and the N+-type semiconductor region 122.b; and (D3) removing the metal layer and performing heating to a second temperature, thus forming the first silicide layer 170 into a second silicide layer 170.

Figure 31A:
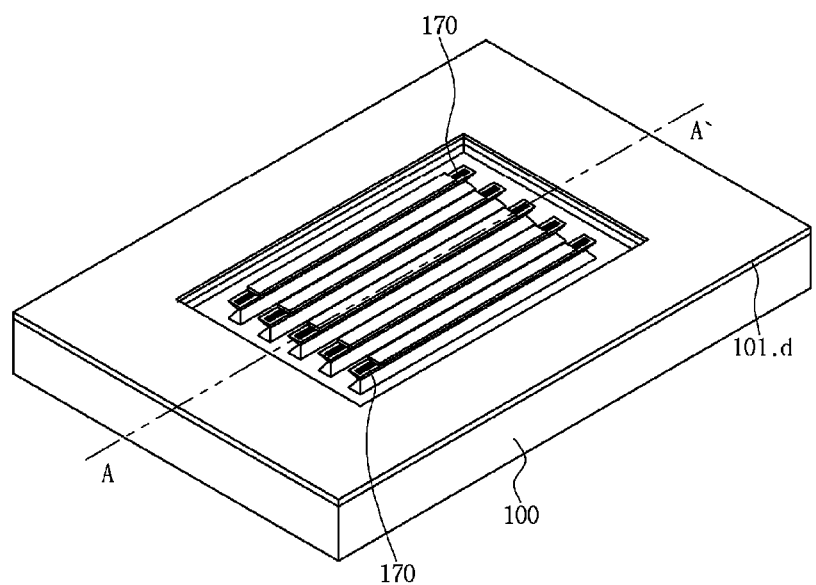
FIG. 31A illustrates the formation of a silicon oxide film on the substrate of FIG. 30A, the removal of the oxide film from the $N^+$-type region and the $P^+$-type region, and the formation of a silicide.
Figure 31B:
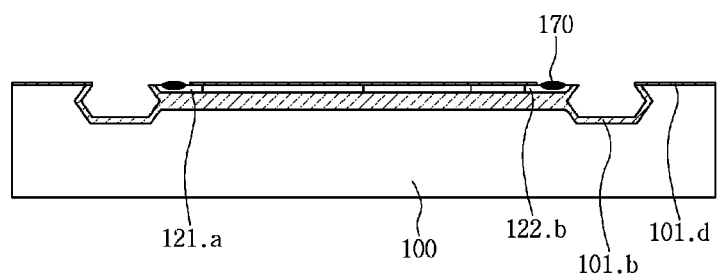
FIG. 31B is a cross-sectional view taken along the line A-A' of FIG. 31A.

With reference to FIGS. 31A and 31B, the fourth silicon oxide film 101.d is formed on the surface of the substrate 100 having the avalanche photodiode array 150, and is then patterned through photolithography so as to expose the N$^+$-type semiconductor region 122.b and the P$^+$-type semiconductor region 121.a at both ends of the avalanche photodiode, and the fourth silicon oxide film 101.d is removed from the N$^+$-type semiconductor region 122.b and the P$^+$-type semiconductor region 121.a through dry etching. A metal (Ti, Ni, Co, etc.) is deposited on the substrate 100 to which the N$^+$-type semiconductor region 122.b and the P$^+$-type semiconductor region 121.a are exposed, followed by primary thermal treatment, thus forming a first silicide layer 170. The deposited metal is removed, after which secondary thermal treatment is performed to thereby convert the first silicide layer 170 into a second silicide layer 170.

In the present embodiment, a metal (Ti) is deposited on the substrate 100, primary thermal treatment (about 650° C.) is performed to form the first silicide layer 170 (TiSi), the metal (Ti) is removed, and secondary thermal treatment (about 850° C.) is performed, thereby forming the second silicide layer 170 (TiSi$_2$). The silicide layer 170 formed thus functions to reduce contact resistance between the first nanowire 112 and the metal electrode 107. This may be applied to the other embodiments.

Specifically, (E) includes:

(E1) depositing a first dielectric layer 105 on the avalanche photodiode array 150 and performing patterning and etching to form a contact hole 106 so as to expose the second silicide layer 170; and (E2) depositing a metal on the avalanche photodiode array 150 and patterning it, thus forming an electrode 107 connected to the second silicide layer 170.

Figure 32A:
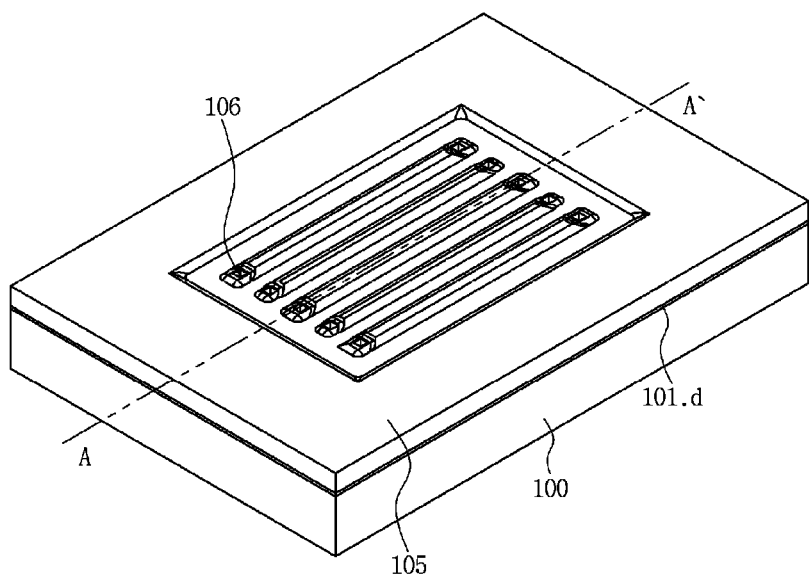
FIG. 32A illustrating the formation of a first dielectric layer on the substrate of FIG. 31A and the formation of a contact hole in the first dielectric layer to expose the silicide through etching.
Figure 32B:
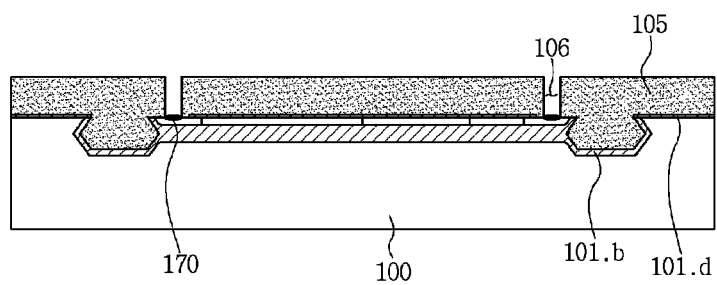
FIG. 32B is a cross-sectional view taken along the line A-A' of FIG. 32A.

With reference to FIGS. 32A and 32B, the first dielectric layer 105 is formed on the substrate 100 having the silicide layer 170 thereon. The first dielectric layer 105 is transparent and thus light may be freely incident, and insulates the substrate 100 from the electrode 107 deposited on the first dielectric layer 105. In the present embodiment, a silicon oxide film ($SiO_2$) is deposited as the first dielectric layer 105.

The contact hole 106 is formed through photolithography and etching so as to expose the silicide layer 170 of the avalanche photodiode array 150, whereby the electrode 107 is formed on the portion of the avalanche photodiode array 150 where the second silicide layer 170 is formed.

Figure 33A:
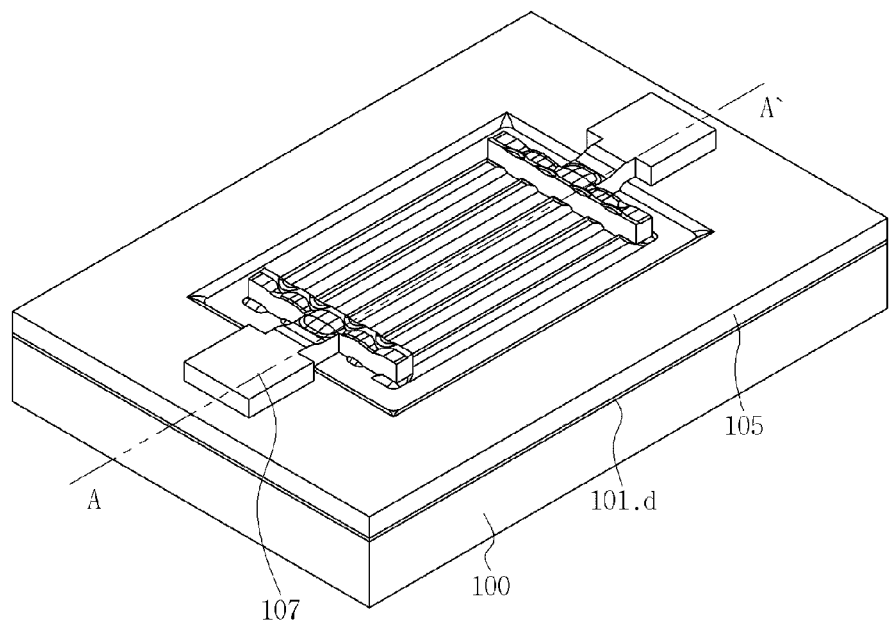
FIG. 33A illustrating the deposition of a metal on the substrate having the contact hole of FIG. 32A and the patterning of the metal electrode through etching.
Figure 33B:
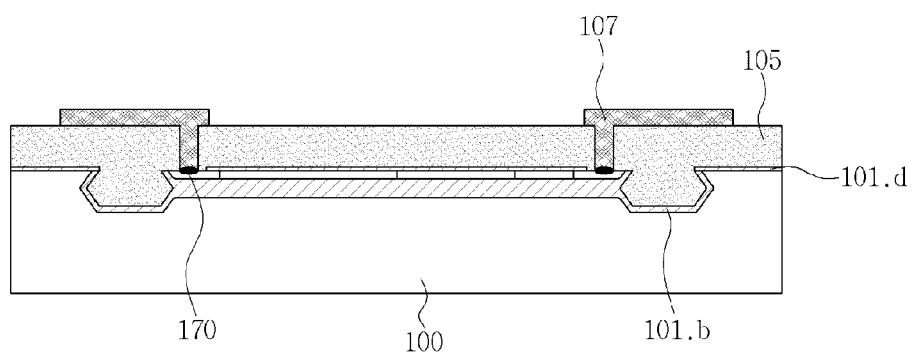
FIG. 33B is a cross-sectional view taken along the line A-A' of FIG. 33A.

Next, with reference to FIGS. 33A and 33B, a metal for forming the electrode 107 is deposited on the substrate 100 having the contact hole 106 therein. In order to reduce contact resistance between the metal for the electrode 107 and the silicide layer 170, thermal treatment may be further performed. The metal electrode 107 is patterned through photolithography and dry etching. The metal electrode 107 is formed such that silicon nanowire avalanche photodiodes included in the avalanche photodiode array 150 are connected in parallel. The construction of the metal electrode 107 may vary depending on the design for the silicon nanowire avalanche photodiode.

After the formation of the metal electrode 107, forming a metal layer (W, etc.) for blocking electromigration of the metal electrode 107 on the surface of the electrode 107 may be further performed.

Although the embodiments of the present invention have been disclosed for illustrative purposes regarding the silicon nanowire avalanche photodiode and the silicon nanowire photomultiplier using the same, those skilled in the art will appreciate that various modifications, additions and substitutions are possible, without departing from the scope and spirit of the invention as disclosed in the accompanying claims.

Accordingly, simple modifications or variations of the present invention fall within the scope of the present invention as defined in the accompanying claims.

What is claimed is:

1. A silicon nanowire photomultiplier, comprising:
an avalanche photodiode using a silicon nanowire, the avalanche photodiode comprising:
a first silicon nanowire formed of silicon (Si);
a first conductive region formed on one surface of the first silicon nanowire and doped with a first dopant;
a second conductive region formed on one surface of the first silicon nanowire and extending in the longitudinal direction from the first conductive region and doped with a second dopant having a conductivity type different from that of the first dopant,
wherein the first silicon nanowire is formed on a silicon substrate arranged parallel to a surface of the silicon substrate, has an inverted triangular shape cross-section,
wherein, when a magnitude of a reverse voltage applied to both ends of the first silicon nanowire, the silicon nanowire is configured to generate avalanche multiplication of inner current based on incident light,
wherein the first silicon nanowire further comprises an avalanche region, which is formed at a junction between the first conductive region and the second conductive region and in which avalanche multiplication of inner current occurs due to incidence of light from outside,
wherein the first conductive region is configured such that a P-type semiconductor region, a P(i)-type semiconductor region and a P+-type semiconductor region are sequentially formed in a longitudinal direction, and
wherein the second conductive region is configured such that an N-type semiconductor region and an N+-type semiconductor region are sequentially formed in a longitudinal direction so as to be arranged continuously from the P-type semiconductor region of the first conductive region; and
a quenching resistor formed of a second silicon nanowire comprising silicon (Si), in which one end of the second silicon nanowire is connected in series to one end of the first silicon nanowire,
wherein the quenching resistor comprises one of a P-type dopant or an N-type dopant, and
wherein the quenching resistor is configured such that the second silicon nanowire is formed at a predetermined interval in a longitudinal direction from one end of the first silicon nanowire, and a $P^+$-type semiconductor region, a P-type semiconductor region and a $P^+$-type semiconductor region are sequentially formed in a longitudinal direction.

2. A silicon nanowire photomultiplier, comprising:
an avalanche photodiode using a silicon nanowire, the avalanche photodiode comprising:
a first silicon nanowire formed of silicon (Si);
a first conductive region formed on one surface of the first silicon nanowire and doped with a first dopant;
a second conductive region formed on one surface of the first silicon nanowire and extending in the longitudinal direction from the first conductive region and doped with a second dopant having a conductivity type different from that of the first dopant,
wherein the first silicon nanowire is formed on a silicon substrate arranged parallel to a surface of the silicon substrate, has an inverted triangular shape cross-section,
wherein, when a magnitude of a reverse voltage applied to both ends of the first silicon nanowire, the silicon nanowire is configured to generate avalanche multiplication of inner current based on incident light,
wherein the first silicon nanowire further comprises an avalanche region, which is formed at a junction between the first conductive region and the second conductive region and in which avalanche multiplication of inner current occurs due to incidence of light from outside,
wherein the first conductive region is configured such that a P-type semiconductor region, a P(i)-type semiconductor region and a P+-type semiconductor region are sequentially formed in a longitudinal direction, and
wherein the second conductive region is configured such that an N-type semiconductor region and an N+-type semiconductor region are sequentially formed in a longitudinal direction so as to be arranged continuously from the P-type semiconductor region of the first conductive region, and a quenching resistor formed of a second silicon nanowire comprising silicon (Si), in which one end of the second silicon nanowire is connected in series to one end of the first silicon nanowire, wherein the quenching resistor comprises one of a P-type dopant or an N-type dopant, and wherein the quenching resistor is configured such that the second silicon nanowire is formed continuously in a longitudinal direction from one end of the first silicon nanowire, and an N-type semiconductor region and an $N^+$-type semiconductor region are sequentially formed in a longitudinal direction.

3. The silicon nanowire photomultiplier of claim 2, wherein the first silicon nanowire and the second silicon nanowire are formed at an upper portion of a silicon nanowire structure having an inner angle θ that falls within a predetermined range, and a line width a of the silicon nanowire is determined by Equation 1 below:

$$a = W - 2*0.45*T*((1+\cos(\theta))/(\sin(\theta)))$$ [Equation 1]

(wherein a is the line width of a silicon nanowire, W is the width of the silicon nitride film of a silicon nanowire structure, T is the thickness of an oxide film formed on the surface of the silicon nanowire structure, and θ is the inner angle of the silicon nanowire structure).

4. A silicon nanowire photomultiplier, comprising:

an avalanche photodiode array comprising one or more avalanche photodiodes, which are spaced apart from each other at a predetermined interval in a width direction, the avalanche photodiodes comprising:

a first silicon nanowire formed of silicon (Si);

a first conductive region formed on one surface of the first silicon nanowire and doped with a first dopant;

a second conductive region formed on one surface of the first silicon nanowire and extending in the longitudinal direction from the first conductive region and doped with a second dopant having a conductivity type different from that of the first dopant, wherein the first silicon nanowire is formed on a silicon substrate arranged parallel to a surface of the silicon substrate, has an inverted triangular shape cross-section, wherein, when a magnitude of a reverse voltage applied to both ends of the first silicon nanowire, the silicon nanowire is configured to generate avalanche multiplication of inner current based on incident light; and a quenching resistor array comprising one or more quenching resistors, which are formed of silicon nanowires and are electrically connected to one end of the first silicon nanowire, wherein the quenching resistor array is configured such that the quenching resistors comprise one of a P-type dopant or an N-type dopant, and wherein the quenching resistor array is spaced apart from one end of the avalanche photodiode array at a predetermined interval in a longitudinal direction, and each of the quenching resistors is configured such that a $P^+$-type semiconductor region, a P-type semiconductor region and a $P^+$-type semiconductor region are sequentially formed in a longitudinal direction.

5. A silicon nanowire photomultiplier, comprising:

an avalanche photodiode array comprising one or more avalanche photodiodes, which are spaced apart from each other at a predetermined interval in a width direction, the avalanche photodiodes comprising:

a first silicon nanowire formed of silicon (Si);

a first conductive region formed on one surface of the first silicon nanowire and doped with a first dopant; and a second conductive region formed on one surface of the first silicon nanowire and extending in the longitudinal direction from the first conductive region and doped with a second dopant having a conductivity type different from that of the first dopant, wherein the first silicon nanowire is formed on a silicon substrate arranged parallel to a surface of the silicon substrate, has an inverted triangular shape cross-section, wherein, when a magnitude of a reverse voltage applied to both ends of the first silicon nanowire, the silicon nanowire is configured to generate avalanche multiplication of inner current based on incident light; and a quenching resistor array comprising one or more quenching resistors, which are formed of silicon nanowires and are electrically connected to one end of the first silicon nanowire, wherein the quenching resistor array is configured such that the quenching resistors comprise one of a P-type dopant or an N-type dopant, and wherein the quenching resistor array is formed continuously in a longitudinal direction from one end of the avalanche photodiode array, and each of the quenching resistors is configured such that an N-type semiconductor region and an $N^+$-type semiconductor region are sequentially formed in a longitudinal direction.

* * * * *